US006371587B1

(12) United States Patent
Chang

(10) Patent No.: US 6,371,587 B1
(45) Date of Patent: Apr. 16, 2002

(54) INK JET RECORDING APPARATUS

(75) Inventor: Junhua Chang, Nagano (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/583,873

(22) Filed: May 31, 2000

(30) Foreign Application Priority Data

May 31, 1999 (JP) ........................................ 11-152256
Sep. 29, 1999 (JP) ........................................ 11-275676
Oct. 6, 1999 (JP) ........................................ 11-286062
Apr. 21, 2000 (JP) ........................................ 2000-120468

(51) Int. Cl.[7] ........................ B41J 29/38; H01L 4/06; H01L 41/08

(52) U.S. Cl. ............................ 347/11; 347/9; 347/10; 310/316.1

(58) Field of Search ................................ 347/9, 10, 11

(56) References Cited

U.S. PATENT DOCUMENTS 4,639,735 A * 1/1987 Yamamoto et al. ........... 347/89
4,714,935 A * 12/1987 Yamamoto et al. ........... 347/10
5,202,659 A * 4/1993 DeBonte et al. .............. 347/11
5,402,159 A * 3/1995 Takahashi et al. ............ 347/9
5,589,864 A * 12/1996 Hadimioglu ................. 347/46
5,757,392 A * 5/1998 Zhang ......................... 347/14
6,132,021 A * 10/2000 Smith et al. ................... 347/6

FOREIGN PATENT DOCUMENTS

EP 0 827838 A * 3/1998 .............. B41J/2/21
JP 09 234865 9/1997 ............ B41J/2/045
JP 09 234866 9/1997 ............ B41J/2/045
JP 11 058719 3/1999 .............. B41J/2/01
JP 11 058781 3/1999 ............ B41J/2/125

* cited by examiner

*Primary Examiner*—John Barlow
*Assistant Examiner*—Alfred Dudding
(74) *Attorney, Agent, or Firm*—Sughrue Mion, PLLC

(57) ABSTRACT

A first supply switch is connected between a piezoelectric vibrator and a drive signal line for supplying a drive signal to the piezoelectric vibrator in order to control a waveform element supplier. A second supply switch is connected between the drive signal line and the piezoelectric vibrator in parallel with the first supply switch. A rectifier connected in serial with the second supply switch such that a current flow direction from the drive signal line to the piezoelectric vibrator is defined as a forward direction.

29 Claims, 26 Drawing Sheets

FIG. 5A

| | T1 | T2a | T2b |
|---|---|---|---|
| FIRST SUPPLY SWITCH | ON | OFF | OFF |
| SECOND SUPPLY SWITCH | OFF | OFF | ON |

FIG. 5B

| | T1 | T2a | T2b |
|---|---|---|---|
| FIRST SUPPLY SWITCH | OFF | OFF | OFF |
| SECOND SUPPLY SWITCH | OFF | OFF | ON |

FIG. 7A

| | T1 | T2a | T2b |
|---|---|---|---|
| FIRST SUPPLY SWITCH | ON | ON | ON |
| SECOND SUPPLY SWITCH | OFF | OFF | ON |

FIG. 7B

| | T1 | T2a | T2b |
|---|---|---|---|
| FIRST SUPPLY SWITCH | OFF | OFF | OFF |
| SECOND SUPPLY SWITCH | OFF | OFF | ON |

FIG. 9A

| | T1 | T2a | T2b | T1' | T2a' | T2b' |
|---|---|---|---|---|---|---|
| FIRST SUPPLY SWITCH | OFF | OFF | OFF | ON | OFF | OFF |
| SECOND SUPPLY SWITCH | OFF | OFF | ON | OFF | OFF | ON |

FIG. 9B

| | T1 | T2a | T2b | T1' | T2a' | T2b' |
|---|---|---|---|---|---|---|
| FIRST SUPPLY SWITCH | ON | OFF | OFF | OFF | OFF | OFF |
| SECOND SUPPLY SWITCH | OFF | OFF | ON | OFF | OFF | ON |

FIG. 9C

| | T1 | T2a | T2b | T1' | T2a' | T2b' |
|---|---|---|---|---|---|---|
| FIRST SUPPLY SWITCH | OFF | OFF | OFF | OFF | OFF | OFF |
| SECOND SUPPLY SWITCH | OFF | OFF | ON | OFF | OFF | ON |

| GRADATION VALUE | FIRST PULSE | SECOND PULSE | THIRD PULSE | FOURTH PULSE | DECODED VALUE |
|---|---|---|---|---|---|
| 1 (0 0) | × | × | × | ○ | 0 0 0 1 |
| 2 (0 1) | × | ○ | × | × | 0 1 0 0 |
| 3 (1 0) | ○ | × | × | × | 1 0 0 0 |
| 4 (1 1) | ○ | × | ○ | × | 1 0 1 0 |

INK JET RECORDING APPARATUS

BACKGROUND OF THE INVENTION

This invention relates to an ink jet recording apparatus comprising a recording head for jetting ink drops through nozzle orifices by selectively supplying a drive signal to each piezoelectric vibrator.

An ink jet recording apparatus such as an ink jet printer comprises a recording head having a large number of nozzle orifices formed as the nozzle orifices are arranged like rows. The recording head may comprise pressure generating chambers communicating with the nozzle orifices and piezoelectric vibrators for expanding and contacting the pressure generating chambers, thereby changing the ink pressure in each pressure generating chamber. In such a recording head, a drive signal is supplied to each piezoelectric vibrator, thereby changing ink pressure for jetting an ink drop through the nozzle orifice.

For an ink jet recording apparatus of this kind, an art for jetting different amounts of ink drops through one nozzle orifice is proposed to satisfy contradictory needs for improving the image quality and improving the record speed. For example, a necessary waveform element is selected appropriately from a drive signal sequence comprising a plurality of waveform elements connected and the selected waveform element is supplied to a piezoelectric vibrator, thereby jetting a plurality of types of ink drops different in amount.

Each piezoelectric vibrator used with the recording head is considered as an ideal condenser. That is, it is considered that the potential of the piezoelectric vibrator (segment potential) continues to hold the potential at the point in time at which the previous waveform element supply is stopped. Based on this consideration, the termination potential of the previously supplied waveform element and the initial potential of the later supplied waveform element are put into the same level.

However, it is found that the actual piezoelectric vibrator has insulating resistance and that if it is left standing without supplying a drive signal, the potential gradually drops because of natural discharge. The potential drop is caused by non uniformity of piezoelectric substance in piezoelectric layer, for example.

The longer the time between the supply end of the previous waveform element and the supply start of the subsequent waveform element, namely, the longer the supply period of no drive signal, the larger the potential drop amount.

The potential drop is noticeable as the film thickness is thinner (the field effect strength becomes stronger). Thus, with the recently required piezoelectric vibrator having a small volume (thin thickness), the difference between the potential and the initial potential of the subsequent waveform element becomes large if the supply period of no drive signal is extremely short.

If the subsequent waveform element is supplied to the piezoelectric element in a state in which the difference between the potential and the initial potential of the subsequent waveform element is large, the piezoelectric potential varies largely in a short time just after supply of the waveform element starts. Consequently, rapid deformation occurs in the piezoelectric vibrator and an ink drop is jetted in error; this is a problem. Since a large current exceeding the allowable range flows into the piezoelectric vibrator, the function of the piezoelectric vibrator can be degraded and the piezoelectric vibrator can be destroyed.

SUMMARY OF THE INVENTION

It is therefore an object of the invention to prevent ink drops from being jetted in error and a piezoelectric vibrator from being destroyed for enhancing the reliability of a recording apparatus by easing a rapid rise in the potential in the piezoelectric vibrator.

In order to achive the above object, according to the present invention, there is provided an ink jet recording apparatus comprising:

a recording head including a piezoelectric vibrator to be deformed for varying the volume of a pressure generating chamber communicated with a nozzle orifice to eject an ink drop therefrom;

a drive signal generator for generating a drive signal in which a plurality of waveform elements are connected;

a waveform element supplier for selectively supplying at least two waveform elements from the drive signal to the piezoelectric vibrator; and a potential difference compensator for compensating a potential difference between a termination potential of a previous waveform element and an initial potential of a subsequent waveform element respectively selected by the waveform element supplier.

According to the above configuration, the termination potential of the previous waveform element and the initial potential of the subsequent waveform element can be matched with each other by the potential difference compensator. Thus, a rapid rise in the potential of the piezoelectric vibrator when the subsequent waveform element is supplied can be eased. Therefore, the disadvantages involved in the rapid rise in the potential, such as erroneous jetting of an ink drop and destroying of the piezoelectric vibrator, can be prevented. Consequently, the reliability of the recording apparatus can be enhanced.

Prefereably, the potential difference compensator includes:

a first supply switch connected between the piezoelectric vibrator and a drive signal line for supplying the drive signal to the piezoelectric vibrator in order to control the waveform element supply;

a second supply switch connected between the drive signal line and the piezoelectric vibrator in parallel with the first supply switch;

a first switch controller for supplying a first switching signal to the first switch for controlling the same;

a second switch controller for supplying a second switching signal to the second switch for controlling the same; and a rectifier connected in serial with the second supply switch such that a current flow direction from the drive signal line to the piezoelectric vibrator is defined as a forward direction.

Preferably, the drive signal includes a first waveform element for deforming the piezoelectric vibrator and, a second waveform element, one portion of which is convex to the lower potential side;

wherein the first switch controller generates the first switching signal in at least a part of a period while the first waveform element is generated; and wherein the second switch controller generates the second switching signal at a predetermined timing in a period while the second waveform element is generated so as to turn on the second supply switch.

Preferably, the lowest potential of the second waveform element is lower than a potential of the piezoelectric vibrator at the time where the second switch is turned on.

Preferably, the second switch controller generates the second switching signal for turning on the second switch in a period while the potential of the second waveform element is rising.

According to the above configuration, an electric current flows into the piezoelectric vibrator through the second supply switch and the rectifier only when the waveform element potential becomes higher than the piezoelectric potential by previously turning on the second supply switch in a state in which the potential lowers. Consequently, a rapid rise in the potential can be eased.

Alternatively, the potential difference compensator includes an initial potential setter for lowering an initial potential of the subsequent waveform element than a termination potential of the previous waveform element in response to potential drop of the piezoelectric vibrator.

Preferably, the subsequent waveform element includes a compensation element for restoring the potential thereof from the initial potential to the termination potential of the previous waveform element.

Preferably, the waveform supplier includes a compensation element collective supplier for supplying the compensation element to every piezoelectric vibrator collectively.

Preferably, the waveform supplier includes a compensation element selectively supplier for supplying the compensation element to a predetermined piezoelectric vibrator selectively.

Preferably, the initial potential setter includes an initial potential adjuster for adjusting the initial potential of the subsequent waveform element.

Preferably, the ink jet recording apparatus further comprises an environment information detector for acquiring information of an environment surrounding the recording head. The environment information includes at least one of temperature information and humidity information. The initial potential adjuster adjusts the initial potential of the subsequent waveform element in accordance with the detected environment information.

Preferably, the initial potential adjuster adjusts the initial potential of the subsequent waveform element such that the difference between the termination potential of the previous waveform element and the initial potential of the subsequent waveform element becomes larger as the termination potential of the previous waveform element is higher.

Preferably, the initial potential adjuster adjusts the initial potential of the subsequent waveform element such that the difference between the termination potential of the previous waveform element and the initial potential of the subsequent waveform element becomes larger as the time period between the termination of the previous waveform element and the start end of the subsequent waveform element is longer.

Preferably, the ink jet recording apparatus further comprises a potential detector for detecting a potential of the piezoelectric vibrator. The initial potential adjuster adjusts the initial potential of the subsequent waveform element in accordance with the detected potential of the piezoelectric vibrator.

According to the above configuration, the difference between the potential and the initial potential of the waveform element can be made extremely small even if the potential is dropped during the period in which no drive signal is supplied, namely, from the time at which supply of the previous waveform element is terminated to the time at which supply of the subsequent waveform element is started. Thus, a rapid rise in the potential just after supply of the subsequent waveform element is started can be prevented.

According to the present invention, there is also privided an ink jet recording head comprising:

a recording head including a piezoelectric vibrator to be deformed for varying the volume of a pressure generating chamber communicated with a nozzle orifice to eject an ink drop therefrom;

a drive signal generator for generating a drive signal in which a plurality of waveform elements are connected;

a waveform element supplier for selectively supplying at least one waveform element from the drive signal to the piezoelectric vibrator; and a termination potential supplier for maintaining a potential of the piezoelectric vibrator during a period in which no waveform element is supplied at a termination potential of a reference waveform element supplied just before.

Preferably, the termination potential supplier supplies a potential corresponding to the termination potential of the reference waveform element after the waveform supplier has been finished to supply the reference waveform element.

Preferably, the waveform element supplier includes a first selective switch for selectively supplying at least one of the waveform elements in the drive signal to the piezoelectric vibrator. The termination potential supplier includes a second selective switch for supplying the potential corresponding to the termination potential of the reference waveform element to the piezoelectric element selectively.

Preferably, the ink jet recording apparatus further comprises a print controller for generating a latch signal. The first selective switch is on/off controlled by the latch signal and the second selective switch is controlled on/off controlled by a signal generated by inverting the latch signal.

Preferably, the second selective switch is turned on after the expiration of a predetermined time period since the first selective switch has been turned off.

Preferably, the predetermined time period is set in the range of 5 $\mu$sec to 20 $\mu$sec.

Preferably, the termination potential supplier includes a supply source for supplying the termination potential and a current limiter provided between the supply source and the second selective switch.

Preferably, the current limiter is configured as a resistance element connected in series between the supply source and the second selective switch.

Preferably, the waveform element supplier includes a first selective switch for selectively supplying at least one of the waveform elements in the drive signal to the piezoelectric vibrator. The termination potential supplier includes a second selective switch for selectively supplying one of predetermined different potentials in response to a termination potential of a waveform element selectively supplied by the first selective switch.

According to the above configuration, the potential drop caused by natural discharge occurring while the period in which no waveform element is supplied can be suppressed. Therefore, rapid vibration in the potential just after supply of the next drive signal is started can be prevented and the disadvantages involved in the rapid variation in the potential, such as erroneous jetting of an ink drop and degradation or destroying of the piezoelectric vibrator, can be prevented.

Preferably, the piezoelectric vibrator is configured as a piezoelectric element.

Preferably, the piezoelectric vibrator includes a piezoelectric layer and electrodes disposed so as to sandwich the piezoelectric layer. The piezoelectric layer has a thickness in the range of 1 μm to 20 μm.

BRIEF DESCRIPTION OF THE DRAWINGS

In the accompanying drawings:

FIGS. 5A and 5B are drawings to describe on/off control of a first supply switch and a second supply switch in the first embodiment; FIG. 5A shows on/off control at the jetting time and FIG. 5B shows on/off control at the non-jetting time;

FIG. 6A shows the drive signal; FIG. 6B shows the potential at the jetting time; and FIG. 6C shows the potential at the non-jetting time;

FIGS. 7A and 7B are drawings to describe on/off control of a first supply switch and a second supply switch in a second embodiment of the invention; FIG. 7A shows on/off control at the jetting time and FIG. 7B shows on/off control at the non-jetting time;

FIG. 8A shows the drive signal; FIG. 8B shows the potential at the jetting time.

FIGS. 9A to 9C are drawings to describe on/off control of a first supply switch and a second supply switch in a third embodiment of the invention; FIG. 9A shows on/off control at the jetting time of a large ink drop, FIG. 9B shows on/off control at the jetting time of a medium ink drop, and FIG. 9C shows on/off control at the non-jetting time;

FIG. 10A shows the drive signal and FIG. 10B shows the potential at the jetting time of a large ink drop;

FIG. 11A shows the drive signal and FIG. 11B shows the potential at the jetting time of a medium ink drop;

FIG. 12A shows the drive signal and FIG. 12B shows the potential at the non-jetting time;

FIG. 21A shows the action for forming a large dot and FIG. 21B shows the action for forming a medium dot;

FIG. 22A shows the action for forming a small dot and FIG. 22B shows the action for agitating ink;

DETAILED DESCRIPTION OF THE PREFERRED EMBODIMENTS

Referring now to the accompanying drawings, there will be described preferred embodiments of the invention. First, a first embodiment will be discussed wherein when the potential level of a waveform element becomes higher than that of a piezoelectric vibrator, a drive signal is supplied to the piezoelectric vibrator through a rectifier circuit.

Figure 1:
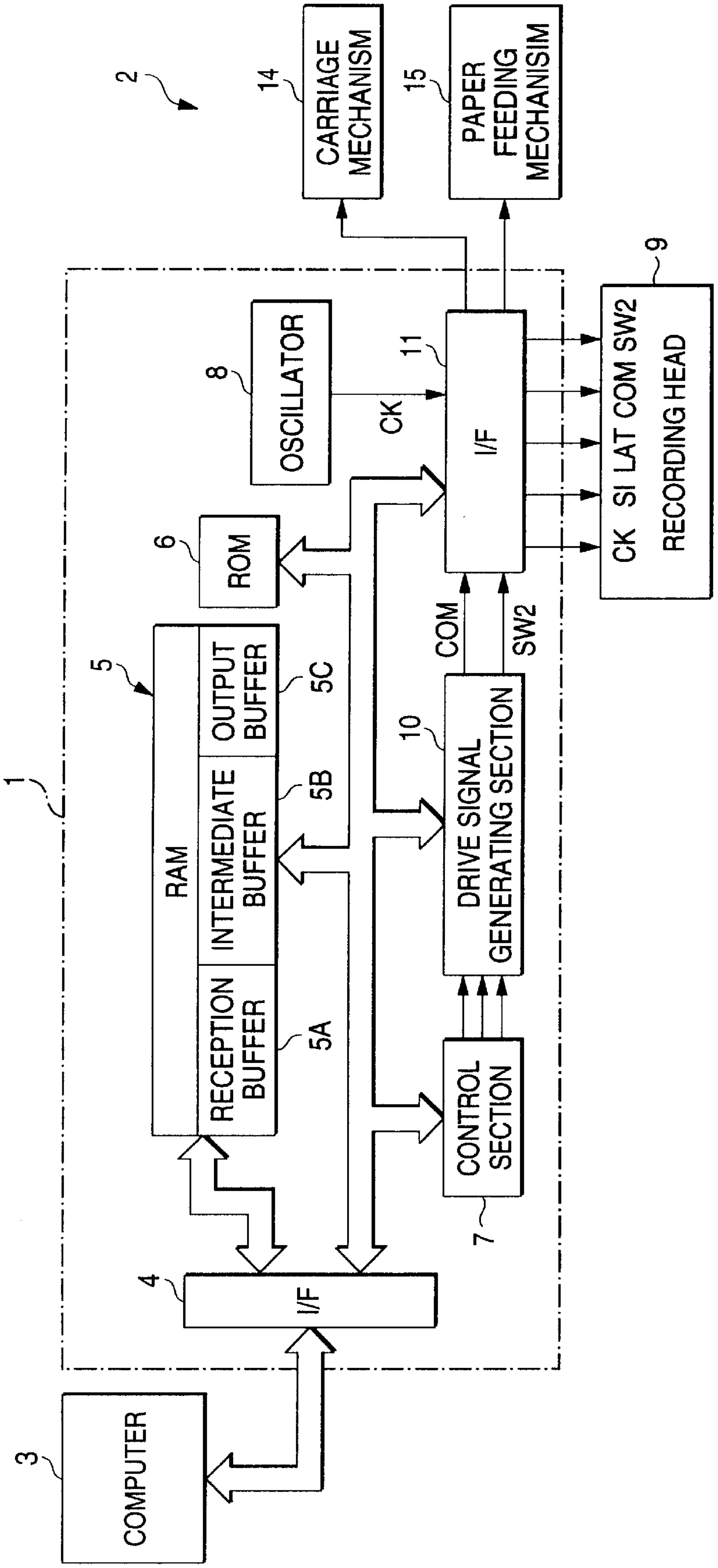
FIG. 1 is a block diagram to describe the general configuration of an ink jet recording apparatus in a first embodiment of the invention.

FIG. 1 is a block diagram to describe the general configuration of an ink jet recording apparatus. The ink jet recording apparatus is roughly made up of a printer controller 1 and a print engine 2.

The printer controller 1 comprises an interface 4 for receiving print data, etc., from a host computer 3, etc., RAM (random access memory) 5 for storing various pieces of data, ROM (read-only memory) 6 for storing control routines, etc., for performing various types of data processing, a control section 7 including a CPU (central processing unit), etc., an oscillator 8, a drive signal generating section 10 for generating a drive signal COM supplied to a recording head 9, and an interface 11 for transmitting the print data expanded into a dot pattern (bit map), the drive signal, and the like to the print engine 2. The drive signal generating section 10 and the control section 7 make up a drive signal generator in the invention.

The interface 4 receives print data made up of any one or more of character code, a graphic function, and image data, for example, from the host computer 3, etc. A busy (BUSY) signal, an acknowledge (ACK) signal, etc., can be output through the interface 4 to the host computer 3.

The RAM 5 is used as a reception buffer 5A, an intermediate buffer 5B, an output buffer 5C, work memory (not shown), etc. The reception buffer 5A temporarily stores the print data received through the interface 4 from the host computer 3. The intermediate buffer 5B stores intermediate code data. Further, the output buffer 5C stores print data expanded into a dot pattern as described later.

The ROM 6 stores the various control routines executed by the control section 7 as described above, font data, graphic functions, etc. The control section 7 has a function of reading the print data in the reception buffer 5A, converting the print data into intermediate code, and storing the provided intermediate code data in the intermediate buffer 5B. Further, the control section 7 has also a function of referencing the font data, graphic function, etc., in the ROM 6 and expanding the intermediate code data read from the intermediate buffer 5B into print data. The provided print data undergoes necessary decoration processing, then stored in the output buffer 5C.

If the print data corresponding to one line is provided, the one-line print data is transmitted in series through the interface 11 to the recording head 9. When one-line print data is output from the output buffer 5C, the contents of the intermediate buffer 5B are erased the control section 7 expands the next intermediate code.

On the other hand, the print engine 2 is made up of a carriage mechanism 14, a paper feeding mechanism 15, and the above-mentioned recording head 9. The carriage mechanism 14 consists of a carriage on which the recording head 9 is mounted, a pulse motor for running the carriage via a timing belt, etc., and the like. The carriage mechanism 14 executes main scanning in the record operation. The paper feeding mechanism 15 is made up of a paper feed motor, a paper feed roller, etc., and feeds recording paper in sequence. That is, the paper feeding mechanism 15 executes subscanning in the record operation.

Figure 2:
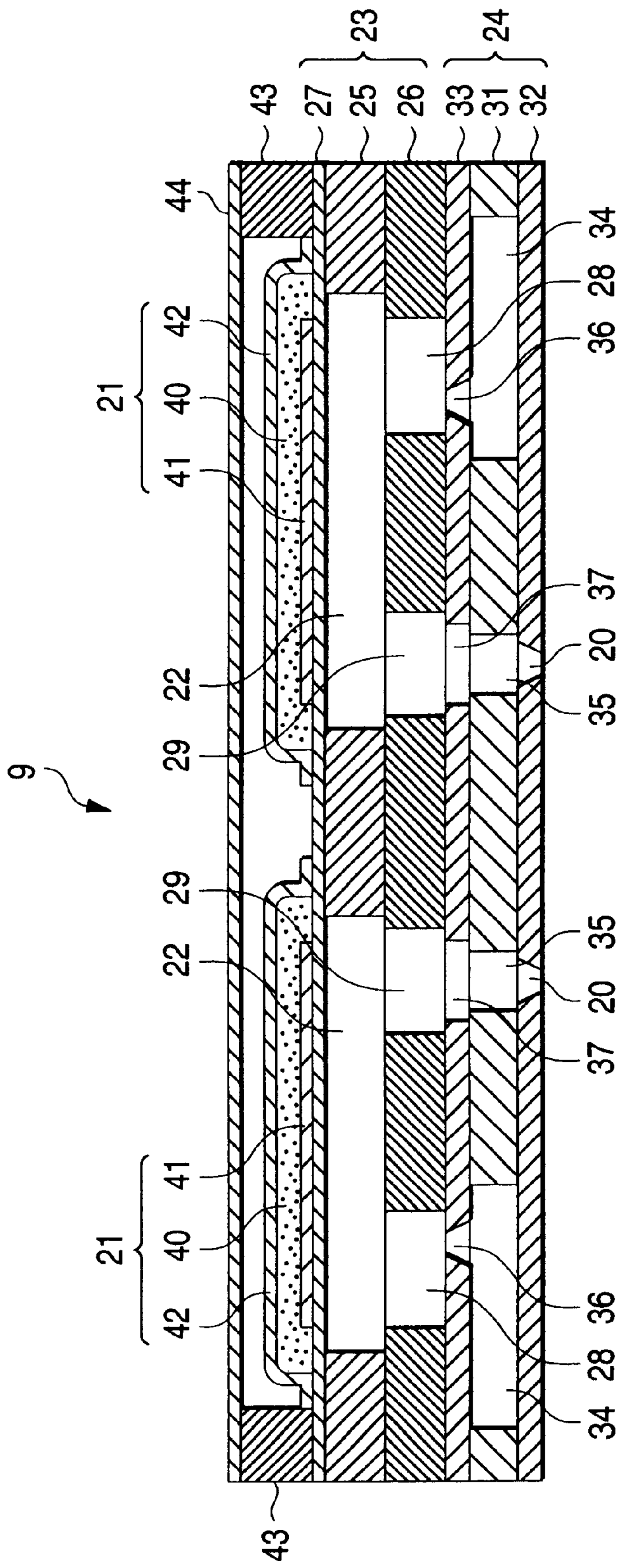
FIG. 2 is a schematic representation to show the mechanical structure of a recording head.

As illustrated in FIG. 2, the recording head 9 has a plurality of (for example, 64) nozzle orifices 20 in the subscanning direction for jetting ink drops from the nozzle orifices 20 as piezoelectric vibrators 21 are deformed. The recording head 9 comprises an actuator unit 23 forming pressure generating chambers 22, a channel unit 24 joined to the front of the actuator unit 23, and the piezoelectric vibrators 21 formed on the rear of the actuator unit 23 corresponding to the pressure generating chambers 22. The piezoelectric vibrator 21 in the embodiment is a piezoelectric vibrator in a deflection vibration mode and is made of a piezoelectric element.

The actuator unit 23 is made up of a substrate 25 formed with the pressure generating chambers 22, a lid member 26 joined to the front of the substrate 25, and a vibration plate 27 joined to the rear of the substrate 25 for closing the rear opening faces of the pressure generating chambers 22. The vibration plate 27 is made of a thin ceramic plate having elasticity, for example. The lid member 26 is formed with first ink flow passages 28 and second ink flow passages 29 communicating with the pressure generating chambers 22.

The channel unit 24 is made up of a substrate 31 formed with reservoirs 34 and nozzle communication ports 35, a nozzle plate 32 provided with a plurality of nozzle orifices 20 is joined to the front of the substrate 31, and a plate 33 provided with ink supply ports 36 and communication ports 37 is joined the rear of the ink chamber formation substrate 31.

The nozzle orifices 20 are arranged like a row and made to communicate with the nozzle communication ports 35 in a one-to-one correspondence. The ink supply ports 36 allow the reservoirs 34 and the first ink flow passages 28 to communicate with each other. The communication ports 37 allow the nozzle communication ports 35 and the second ink flow passages 29 to communicate with each other.

The recording head 9 having the structure described above is formed with ink flow passages each from the reservoir 34 to the ink supply port 36 to the first ink flow passage 28 to the pressure generating chamber 22 to the second ink flow passage 29 to the communication port 37 to the nozzle communication port 35 to the nozzle orifice 20.

The piezoelectric vibrator 21 is formed on the rear of the pressure generating chamber 22 with the vibration plate 27 between. The piezoelectric vibrator 21 is made up of a piezoelectric layer 40, a lower electrode 41 formed on the front of the piezoelectric layer 40, and an upper electrode 42 formed on the rear of the piezoelectric layer 40 so as to cover the piezoelectric vibrator 21, the piezoelectric layer 40 being sandwiched between the electrodes 41 and 42.

The piezoelectric layer 40 is made 20 μm or less, preferably 12 μm or less in thickness, whereby the recording head 9 can be miniaturized while a sufficient exclusion volume is maintained. More preferably, the piezoelectric layer 40 has a thickness in the range of 1 μm to 12 μm in the state of the art.

A connection terminal 43 having a base end part connecting with the upper electrode 42 of each piezoelectric vibrator 21 is disposed in either end part of the actuator unit 23. A flexible circuit board 44 is joined to the tip end face of the connection terminal 43 and a drive signal is supplied through the connection terminal 43 and the upper electrode 42 to the piezoelectric vibrator 21.

In the recording head 9, when a waveform element of a drive signal COM (element supplied to the piezoelectric vibrator 21 for deforming the same; described later) is supplied, a potential difference occurs between the upper electrode 42 and the lower electrode 41. The piezoelectric vibrator 21 is contracted in a direction orthogonal to the electric field, for example, because of the potential difference, and the piezoelectric vibrator 21 and the vibration plate 27 are bent so as to project to the pressure generating chamber 22 side, contacting the pressure generating chamber 22.

In the description to follow, the potential of the upper electrode 42 will be called potential (segment potential). The potential of the lower electrode 41 in the embodiment is adjusted to the ground potential (GND potential).

To jet an ink drop through a nozzle orifice 20, for example, the corresponding pressure generating chamber 22 is contacted rapidly. That is, when the pressure generating chamber 22 is contacted rapidly, the ink pressure in the pressure generating chamber 22 rises and an ink drop is jetted through the nozzle orifice 20 as the ink pressure rises. If the potential difference between the upper electrode 42 and the lower electrode 41 is lessened after the ink drop is jetted, the piezoelectric vibrator 21 and the vibration plate 27 are restored to the former shapes, whereby the inside of the contracted pressure generating chamber 22 is expanded and ink is supplied from the reservoir 34 through the ink supply port 36 and the first ink flow passage 28 to the pressure generating chamber 22.

Figure 3:
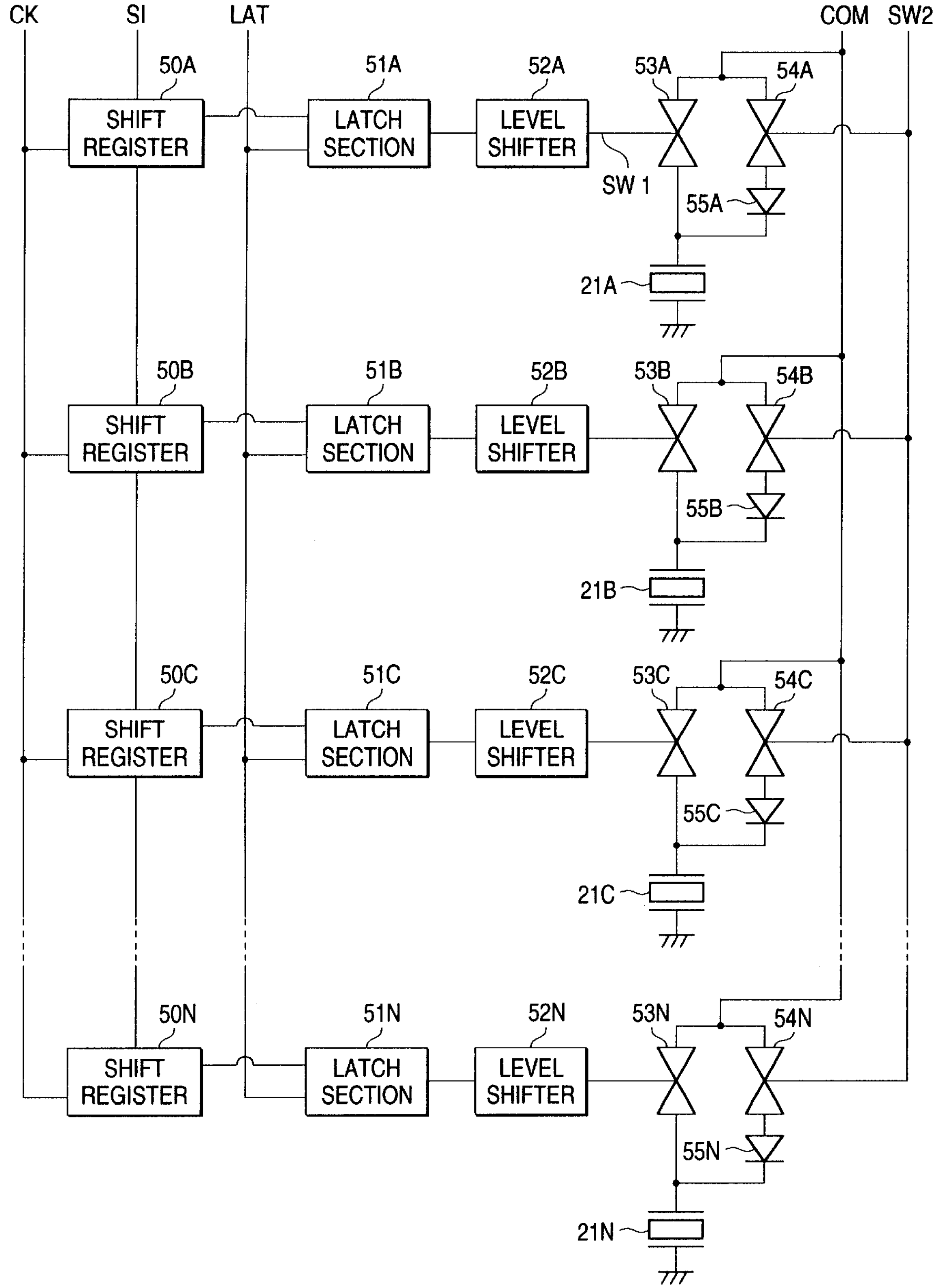
FIG. 3 is a block diagram to describe the electrical configuration of the recording head in the first embodiment.

Next, the electrical configuration of the recording head 9 will be discussed. As shown in FIG. 3, the recording head 9 comprises shift registers 50A to 50N, latch sections 51A to 51N, level shifters 52A to 52N, first supply switches 53A to 53N, second supply switches 54A to 54N, diodes 55A to 55N functioning as rectification elements, and piezoelectric vibrators 21A to 21N provided in a one-to-one correspondence with the nozzle orifices 20.

The shift registers 50, the latch sections 51, the level shifters 52, the first supply switches 53, and the second supply switches 54 function as a waveform element supplier in the invention for selecting a necessary waveform element from a drive signal sequence and supplying the selected waveform element to the piezoelectric vibrator 21, whereby jetting and non-jetting an ink drop can be controlled for each nozzle orifice 20.

Print data SI expanded into dot pattern data is transmitted in series through the interface 11 in synchronization with a clock signal (CK) from the oscillator 8 and is input to the shift registers 50A to 50N. The print data is latched in the latch sections 51A to 51N in synchronization with a latch signal LAT. The latched print data is amplified by the level shifters 52A to 52N to a voltage where the first supply switches 53A to 53N can be driven. The amplified print data is supplied to the first supply switches 53A to 53N. A common switching signal SW2 generated by the drive signal generating section 10 is supplied to the second supply switches 54A to 54N.

A drive signal COM from the drive signal generating section 10 is input to the inputs of the first supply switches 53A to 53N and the piezoelectric vibrators 21A to 21N are connected to the outputs of the first supply switches 53A to 53N. Between a drive signal line and the piezoelectric vibrators 21A to 21N, the second supply switches 54A to 54N and diodes 55A to 55N (which are connected respectively in series with the switches 54A to 54N) are connected in parallel with the first supply switches 53A to 53N. The diodes 55A to 55N are connected so that the current direction from the drive signal line to the piezoelectric vibrators 21A to 21N become forward.

The above-mentioned print data controls the operation of the first supply switch 53. For example, the first supply switch 53 is placed in a connection state and the drive signal COM is supplied to the piezoelectric vibrator 21 during the period in which the print data applied to the first supply switch 53 is "1." The piezoelectric vibrator 21 becomes deformed in response to the supplied drive signal and an ink drop is jetted through the nozzle orifice 20 as the piezoelectric vibrator 21 becomes deformed. On the other hand, supply of the drive signal to the piezoelectric vibrator 21 is shut off during the period in which the print data applied to the first supply switch 53 is "0."

In the period in which the print data is "0," the potential of each piezoelectric vibrator 21 holds the potential at the time just after supply of the drive signal is stopped. Then, the potential drops gradually with the passage of time. It is considered that the potential drops because of a discharge phenomenon caused by the insulating resistance of each piezoelectric vibrator 21.

The common switching signal SW2 controls the operation of the second supply switch 54. For example, the second supply switch 54 is placed in a connection state during the period in which the switching signal SW2 is ON. On the other hand, the second supply switch 54 is placed in a disconnection state during the period in which the switching signal SW2 is OFF.

Figure 4:
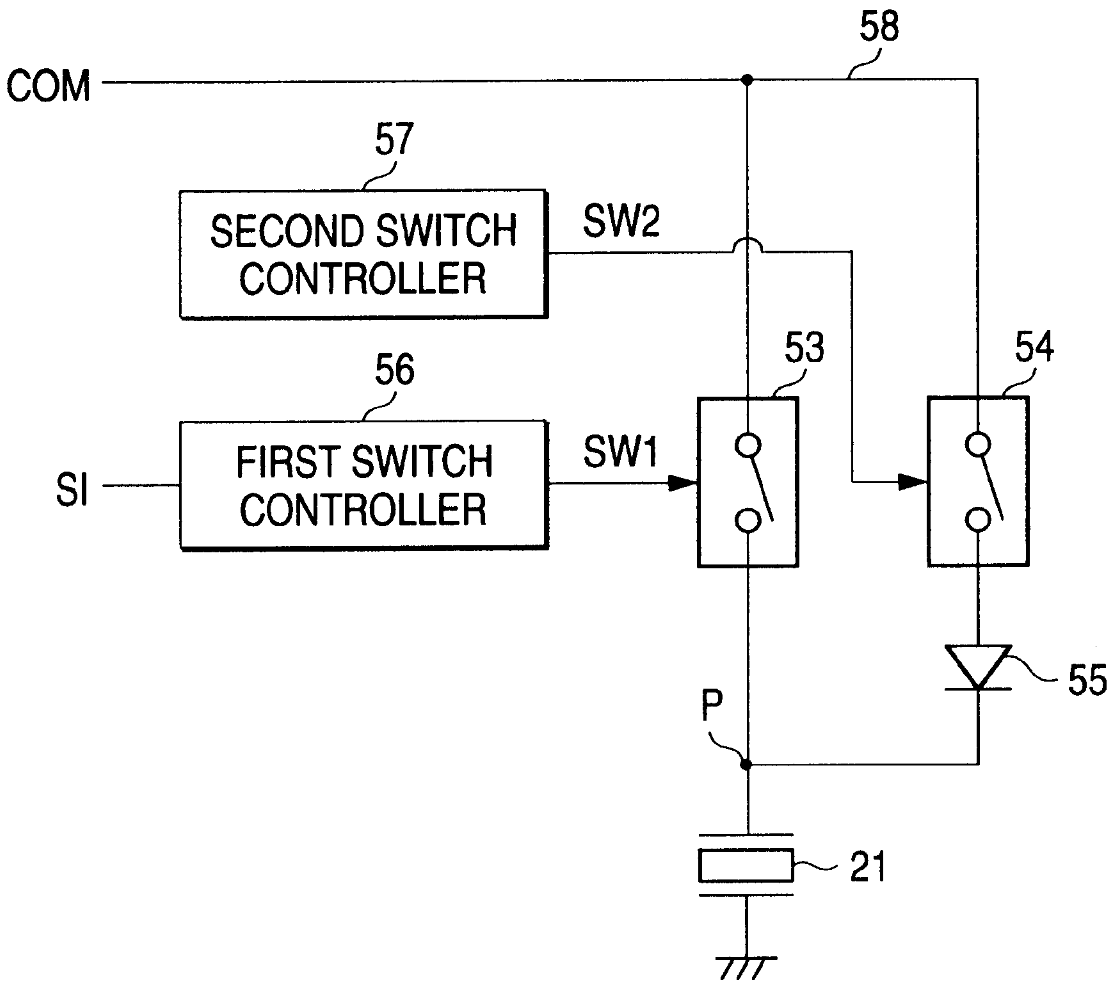
FIG. 4 is a block diagram to describe a drive unit of the recording head in the first embodiment.

Next, a drive unit of the recording head 9 will be discussed. FIG. 4 is a block diagram to show the configuration of the drive unit. The drive unit, which is one embodiment of a potential difference compensator in the invention, comprises a first switch controller 56 comprising a set of the first supply switch 53, the second supply switch 54, the diode 54, the piezoelectric vibrator 21, the shift register 50, the latch section 51, and the level shifter 52 and a second switch controller 57 provided by the drive signal generating section 10.

The piezoelectric vibrator 21 has one electrode grounded and the other electrode connected to the drive signal line 58 through the first supply switch 53. The second supply switch 54 is connected in series to the diode 55, which is connected so as to allow an electric current to flow only into the piezoelectric vibrator 21 side from the drive signal COM side. A pair of the second supply switch 54 and the diode 55 is connected in parallel with the first supply switch 53 between the drive signal line 58 and the piezoelectric vibrator 21.

The second supply switch 54 may be placed on the piezoelectric vibrator 21 side and the diode 55 may be placed on the drive signal line 58 side.

The first switch controller 56 generates a first switching signal SW1 in response to the print data Si and supplies the signal to the first supply switch 53. The second switch controller 57 always generates a second switching signal SW2 at a constant timing regardless of the print data SI and supplies the signal to the second supply switch 54.

Figure 6A:
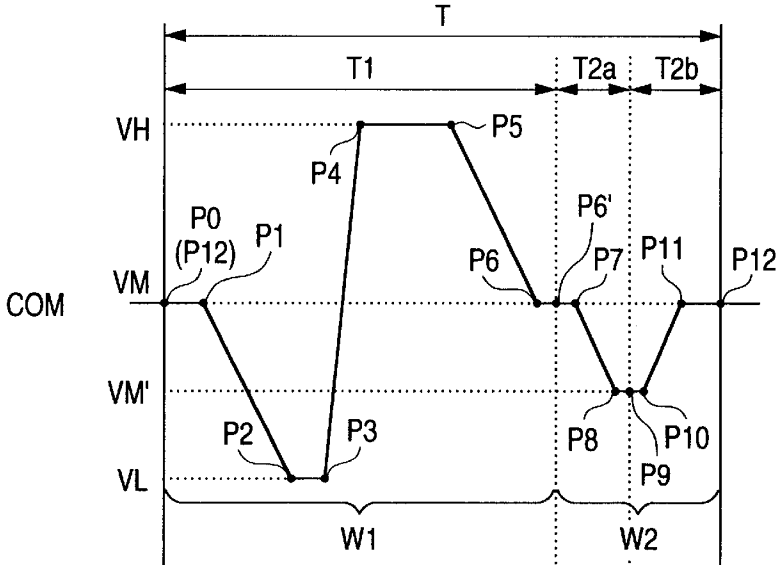
FIGS. 6A to 6C are drawings to describe a drive signal and potential in the first embodiment.
Figure 6B:
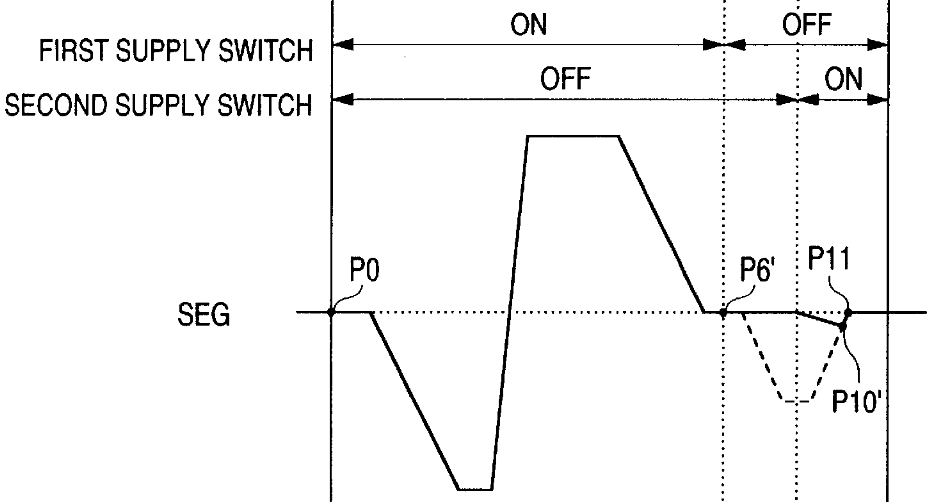
Figure 6C:
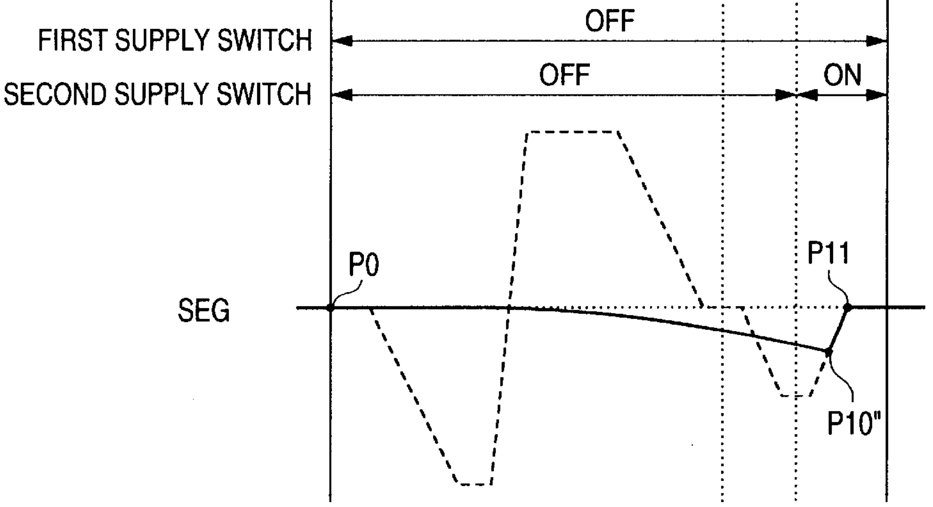

Next, the operation of the drive unit will be discussed. FIGS. SA and 5B are drawings to describe on/off control of the first supply switch 53 and the second supply switch 54 in the embodiment. FIGS. 6A to 6C are drawings to describe the drive signal COM and change in the potential of the piezoelectric vibrator 21 (potential), SEG, and in particular potential change at P point in FIG. 4.

As shown in FIG. 6A, the drive signal COM of the print time T is made up of a first waveform element W1 (P0 to P6) generated at time T1 and a second waveform element W2 (P6' to P12) generated at time T2*a* and T2*b*. The second waveform element W2 has a convex portion on the low potential side (lower side in figure). The first waveform element W1 is a first waveform element in the invention and the second waveform element W2 is a second waveform in the invention. The minimum potential in the drive signal COM is ground potential (0 V) and the maximum potential VH is 36 V. An electric field of the strength responsive to the applied voltage of the drive signal COM acts on the piezoelectric layer 40 of the piezoelectric vibrator 21.

The start end of the first waveform element W1 (P0) is the termination of the second waveform element W2 (P12) in the previous print time T; likewise, the termination of the second waveform element W2 (P12) is the start end of the first waveform element W1 (P0) in the following print time T. The print time T determines the print speed in the recording apparatus.

As shown in FIG. 6B, to eject an ink drop, the first supply switch 53 is turned on at the time T1 and the piezoelectric vibrator 21 is driven in accordance with the drive signal COM. The first supply switch 53 is turned off at the times T2*a* and T2*b*. When the first supply switch 53 is turned off, the potential SEG gradually drops because of natural discharge. On the other hand, the second supply switch 54 is off in the times T1 and T2*a* and is turned on at the time T2*b*. However, the potential of the drive signal COM is lower than the potential SEG at the beginning of the time T2*b*, thus reverse voltage is applied to the diode 55 and no electric current flows. After this, when the potential of the drive signal COM rises and becomes higher than the potential SEG, forward voltage is applied to the diode 55 and thus the potential SEG changes together with voltage change of the drive signal COM.

On the other hand, as shown in FIG. 6C, to eject no ink drops, the first supply switch 53 is off in all times T1, T2*a*, and T2*b* and the potential SEG drops gradually. The second supply switch 54 is off in the times T1 and T2*a* and is turned on at the time T2*b*. However, the potential of the drive signal COM is lower than the electrode potential of the piezoelectric vibrator 21 at the beginning of the time T2*b*, thus reverse voltage is applied to the diode 55 and no electric current flows. After this, when the potential of the drive signal COM rises and becomes higher than the potential SEG of the piezoelectric vibrator 21, forward voltage is applied to the diode 55 and thus the potential SEG changes together with voltage change of the drive signal COM.

In FIG. 6C, the potential SEG changes gently in accordance with the waveform of the drive signal COM in the time T2*b*. Consequently, the piezoelectric vibrator 21 can be operated normally. That is, ink drops can be prevented from being jetted in error and an excessive current can be prevented from flowing into the piezoelectric vibrator 21.

To realize such operation, minimum potential level VM' of the second waveform element W2 is set lower than the potential of the piezoelectric vibrator 21 when the second supply switch 54 is turned on. That is, the minimum potential level VM' is set lower than the potential SEG at the point in time, P9, when the first supply switch 53 is turned off at the point in time, P0.

The second supply switch 54 is switched on from the off state during the portion T2*b* in which the potential rises at a finite non-negative rising rate. The expression "the potential rises at a non-negative finite rising rate" means that the potential rises gently in such a manner that the change rate takes a value of zero or a positive finite value rather than stepwise rise such that the rising rate becomes infinite.

In the embodiment, all second supply switches 54 are subject to on/off control at the same timing regardless of whether or not ink drops are to be jetted. Thus, on/off control of all second supply switches 54 can be performed by one control signal and can be simplified.

Figures 8A, 8B, 8C:
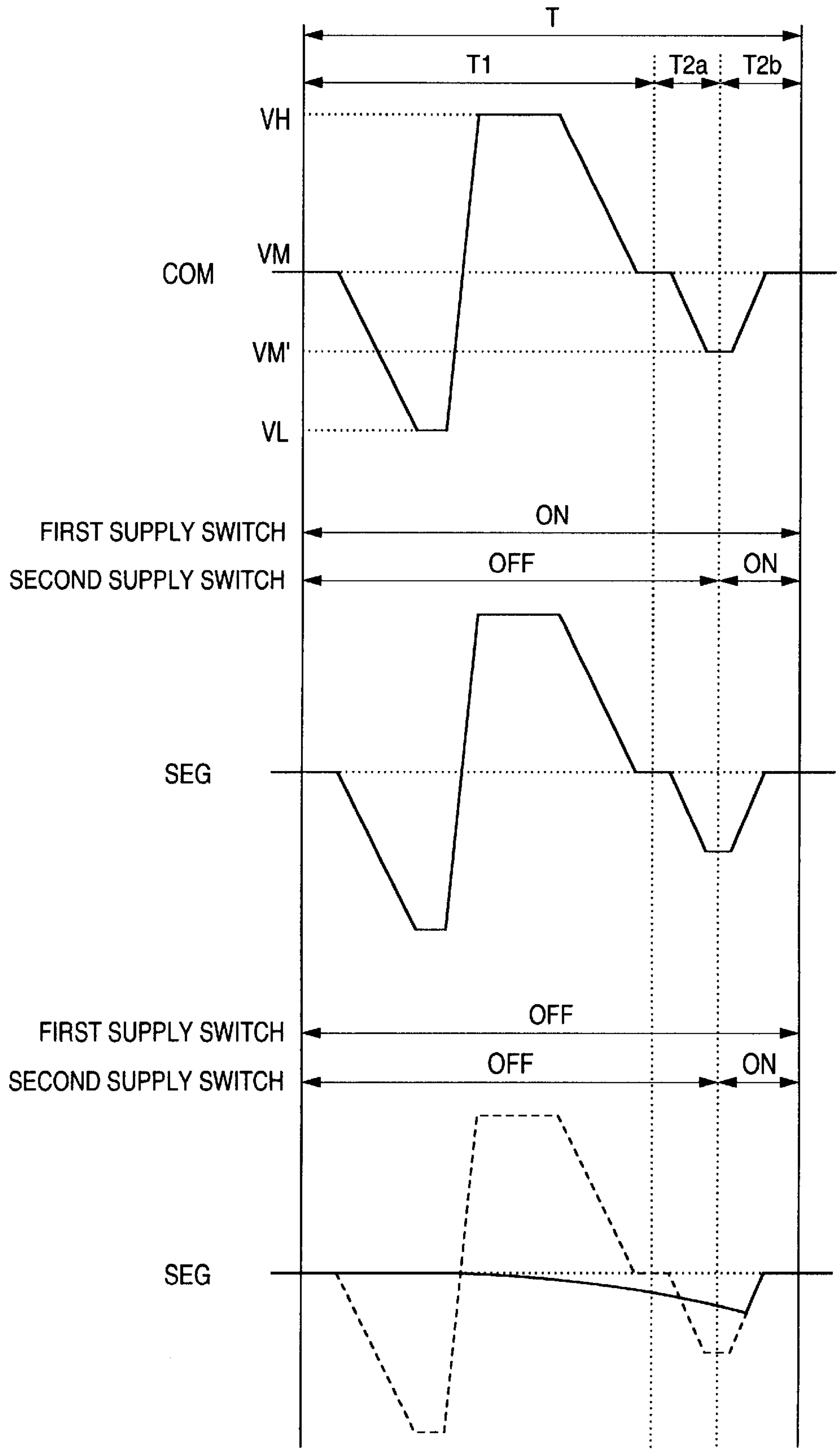
FIGS. 8A to 8B are drawings to describe a drive signal and potential in the second embodiment.
FIG. 8C shows the potential at the non-jetting time.

Next, a second embodiment of the invention wherein different on/off control patterns of first supply switch 53 and second supply switch 54 from those in the first embodiment is adopted will be discussed. FIGS. 7A and 7B are drawings to describe on/off control of the first supply switch 53 and the second supply switch 54 in the second embodiment. FIGS. 8A to 8C are schematic representations to show drive signal COM and change in potential SEG.

Also in the second embodiment, the drive unit shown in FIG. 4 is used intact. As seen from the comparison between FIGS. 5 and 7, the second embodiment differs from the first embodiment only in that the first supply switch 53 is also held on in times T2*a* and T2*b* at the ink drop jetting time. Consequently, as shown in FIG. 8B, the potential SEG changes with change in the drive signal COM in times T2*a* and T2*b*. As shown in FIG. 8C, also in the second embodiment, when the potential of the drive signal COM becomes higher than the potential SEG of a piezoelectric vibrator 21, forward voltage is applied to a diode 55 and thus the potential SEG changes with voltage change of the drive signal COM. Thus, a rapid rise in the electrode potential of the piezoelectric vibrator 21 is eased and the piezoelectric vibrator 21 can be operated normally.

By the way, in the described embodiments, each ink drop is jetted in the same amount. However, the invention can also be applied to an ink jet recording apparatus wherein a plurality of types of ink drops different in amount can be jetted through a single nozzle orifice 20. A third embodiment of the invention intended for this purpose will be discussed.

FIGS. 9A to 9C are drawings to describe on/off control of a first supply switch 53 and a second supply switch 54 in the third embodiment. FIGS. 10 to 12 are schematic representations each to show drive signal COM and change in potential SEG. Also in the third embodiment, the drive unit shown in FIG. 4 is used intact.

As shown in FIG. 10, the drive signal COM is a signal comprising two types of waveforms connected in series for jetting two types of ink drops different in amount (large and medium ink drops). In the third embodiment, the large ink drop is an ink drop having a volume of about 20 pL (picoliters) and the medium ink drop is an ink drop having a volume of about 8 pL (picoliters).

A first waveform W10 is made up of a first waveform element W11 generated in time T1 (P20 to P29') and a second waveform element W12 having a convex portion on the low potential side, generated in times T2*a* and T2*b* (P29' to P34). A second waveform W20 is made up of a first waveform element W21 generated in time T1 ' (P34 to P40') and a second waveform element W22 having a convex portion on the low potential side, generated in times T2*a*' and T2*b*' (P40' to P46).

Figures 10A, 10B:
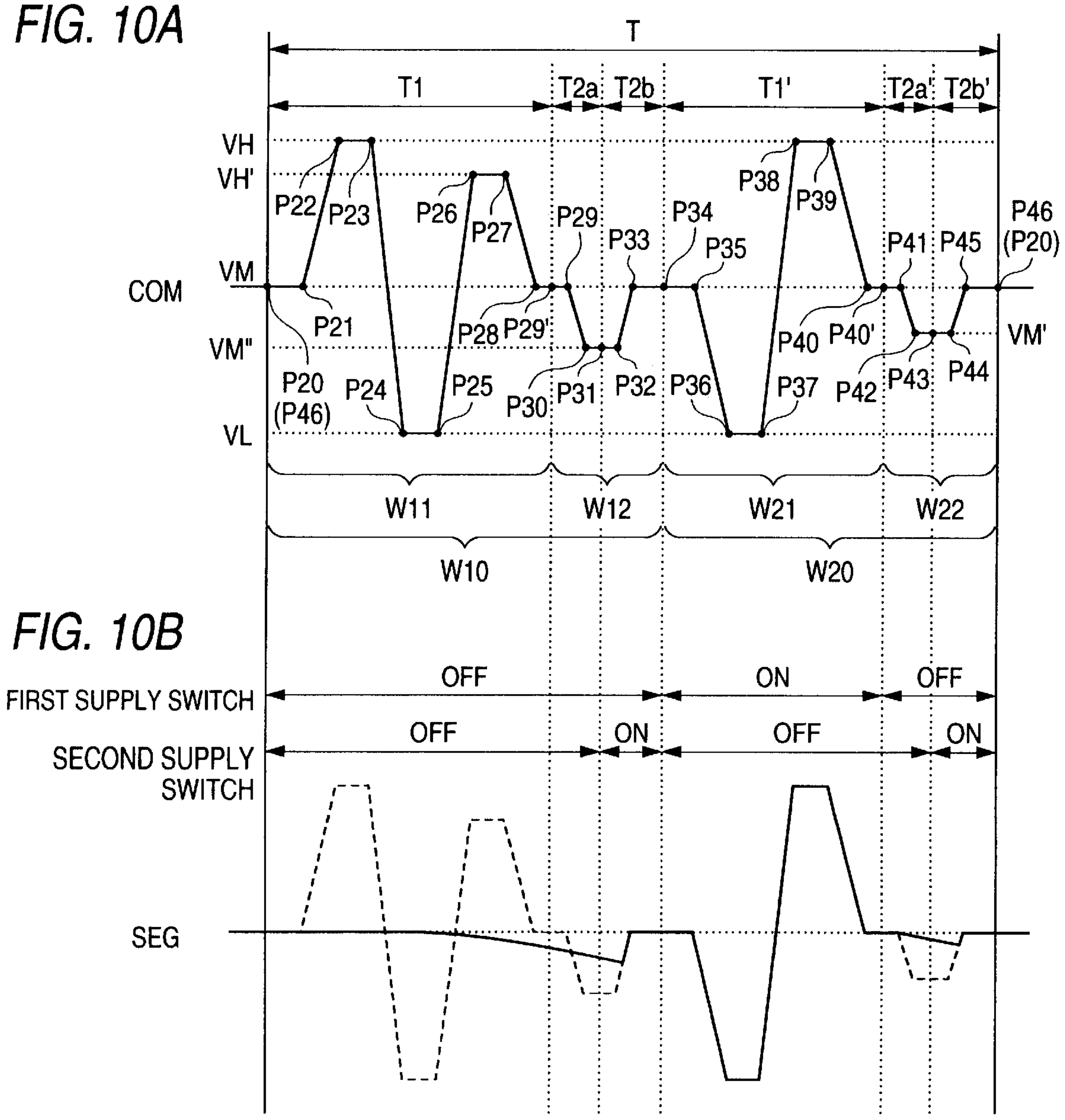
FIGS. 10A and 10B are drawings to describe a drive signal and potential in the third embodiment.
Figure 11A:
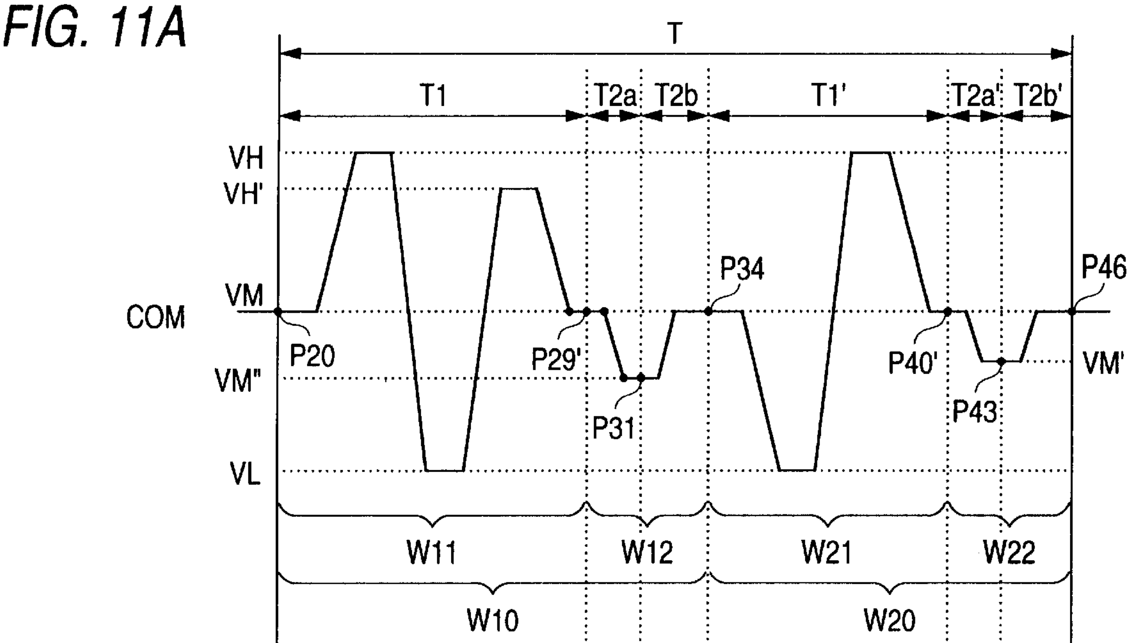
FIGS. 11A and 11B are drawings to describe the drive signal and potential in the third embodiment.

As shown in FIGS. 9A and 10B, to eject a large ink drop, the first supply switch 53 is off in all times T1, T2*a*, and T2*b* of the first waveform W10. The first supply switch 53 is turned on in time T1' of the second waveform W20 and is turned off in times T2*a*' and T2*b*'. On the other hand, the second supply switch 54 is off in times T1 and T2*a* of the first waveform W10 and is turned on in time T2*b*. Likewise, the second supply switch 54 is off in times T1' and T2*a*' of the second waveform W20 and is again turned on in time T2*b*'.

To jet the large ink drop, as seen from the comparison between FIGS. 10 and 6, almost the same operation as that at the non-jetting time shown in FIG. 6C is performed in the period of the first waveform W10 shown in FIG. 10B. Likewise, almost the same operation as that at the jetting time shown in FIG. 6B is performed in the period of the second waveform W20. Therefore, to eject the large ink drop, a rapid rise in the potential SEG can also be eased as in the first embodiment. To realize such operation, minimum potential level VM" of the second waveform element W12 is set lower than the potential of the piezoelectric vibrator 21 when the second supply switch 54 is turned on (namely, at P31). Likewise, minimum potential level VM' of the second waveform element W22 is also set lower than the potential of the piezoelectric vibrator 21 when the second supply switch 54 is turned on (namely, at P43).

As shown in FIG. 11 B, to eject a medium ink drop, the first supply switch 53 is turned on in time T1 of the first waveform W10 and is turned off in times T2*a* and T2*b*. The first supply switch 53 is off in all times T1', T2*a*', and T2*b*' of the second waveform W20. On the other hand, the second supply switch 54 is off in times T1 and T2*a* of the first waveform W10 and is turned on in time T2*b*. Likewise, the second supply switch 54 is off in times T1' and T2*a*' of the second waveform W20 and is again turned on in time T2*b*'.

As seen from the comparison between FIGS. 11 and 6, almost the same operation as that at the jetting time previously described with reference to FIG. 6B is performed in the period of the first waveform W10 shown in FIG. 11 B. Almost the same operation as that at the non-jetting time shown in FIG. 6C is performed in the period of the second waveform W20. Therefore, to eject the medium ink drop, a rapid rise in the potential SEG can also be eased as in the first embodiment. To realize such operation, the minimum potential level VM" of the second waveform element W12 of the first waveform W10 is set lower than the potential of the piezoelectric vibrator 21 when the second supply switch 54 is turned on (namely, at P31). Likewise, the minimum potential level VM' of the second waveform element W22 is also set lower than the potential of the piezoelectric vibrator 21 when the second supply switch 54 is turned on (namely, at P43).

Figure 12A:
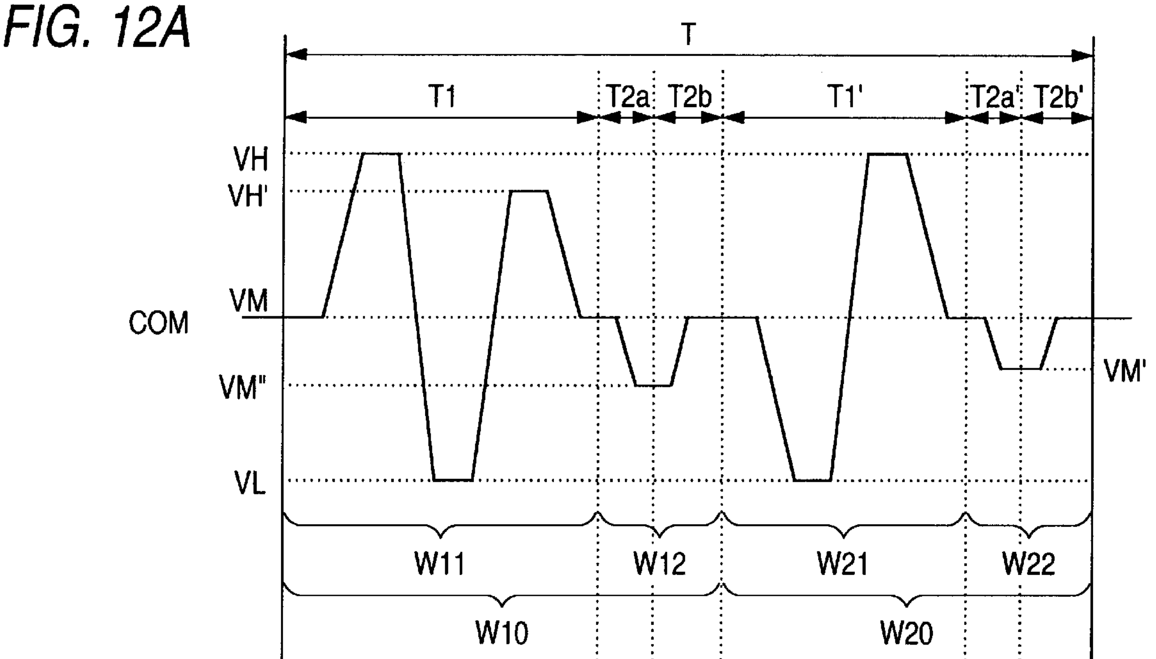
FIGS. 12A and 12B are drawings to describe the drive signal and potential in the third embodiment.
Figure 12B:
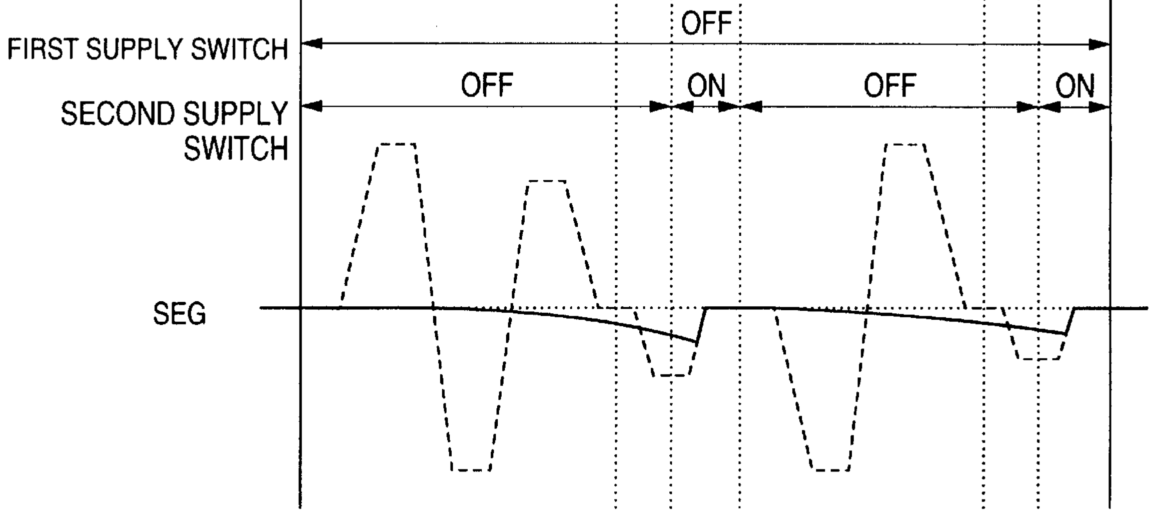

As shown in FIG. 12B, to eject no ink drop, the first supply switch 53 is off in all times T1 to T2*b*' of the first and second waveforms W10 and W20. On the other hand, the second supply switch 54 is off in times T1 and T2*a* of the first waveform W10 and is turned on in time T2*b*. Likewise, the second supply switch 54 is off in times T1' and T2*a*' of the second waveform W20 and is again turned on in time T2*b*'.

Figure 11B:
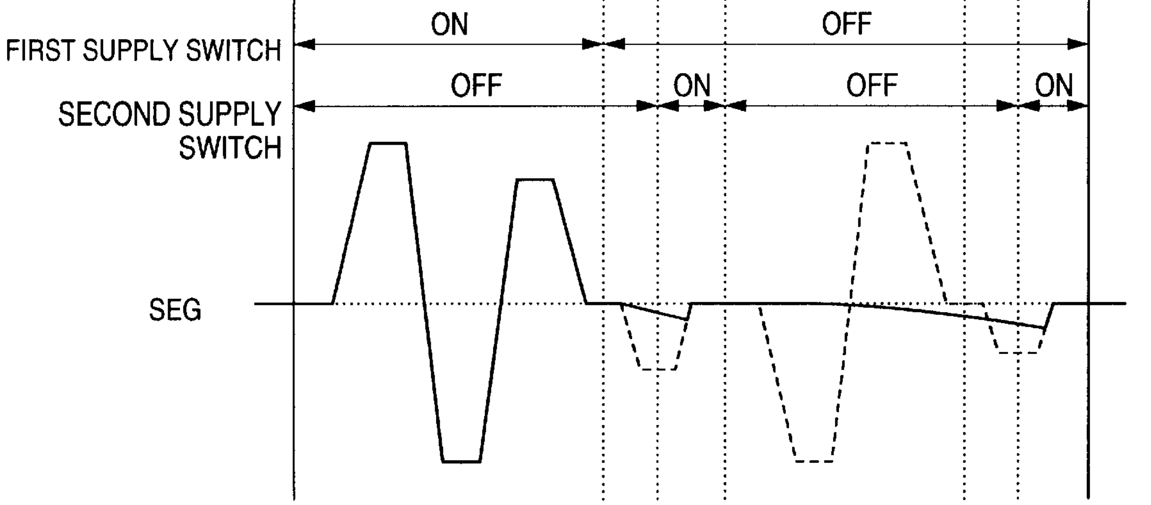

As seen from the comparison between FIGS. 12 and 6, almost the same operation as that at the non-jetting time shown in FIG. 6C is performed in the period of the first waveform W10 shown in FIG. 11B. Almost the same operation as that at the non-jetting time shown in FIG. 6C is performed in all periods of the first waveform W10 and in all periods of the second waveform W20 at the jetting time of no ink drop shown in FIG. 12B. Therefore, to eject no ink drop, a rapid rise in the electrode potential of the piezoelectric vibrator 21 can also be eased as in the first embodiment.

Thus, also in the third embodiment using the drive signal COM containing different waveform elements, a rapid rise in the electrode potential of the piezoelectric vibrator 21 can be eased and each piezoelectric vibrator 21 can be operated normally; ink drops can be prevented from being jetted in error and an excessive current can be prevented from flowing into the piezoelectric vibrator 21.

By the way, in the described embodiments, waveform elements are supplied to the piezoelectric vibrator 21 through the diode 55 as a rectifier circuit. However, the invention is not limited to the configuration. For example, an initial potential setter may be provided for setting the initial potential of the subsequent waveform element selected lower than the termination potential of the previous waveform element selected in response to a potential drop of piezoelectric vibrator 21. A fourth embodiment of the invention comprising such initial potential setter will be discussed.

Figure 13:
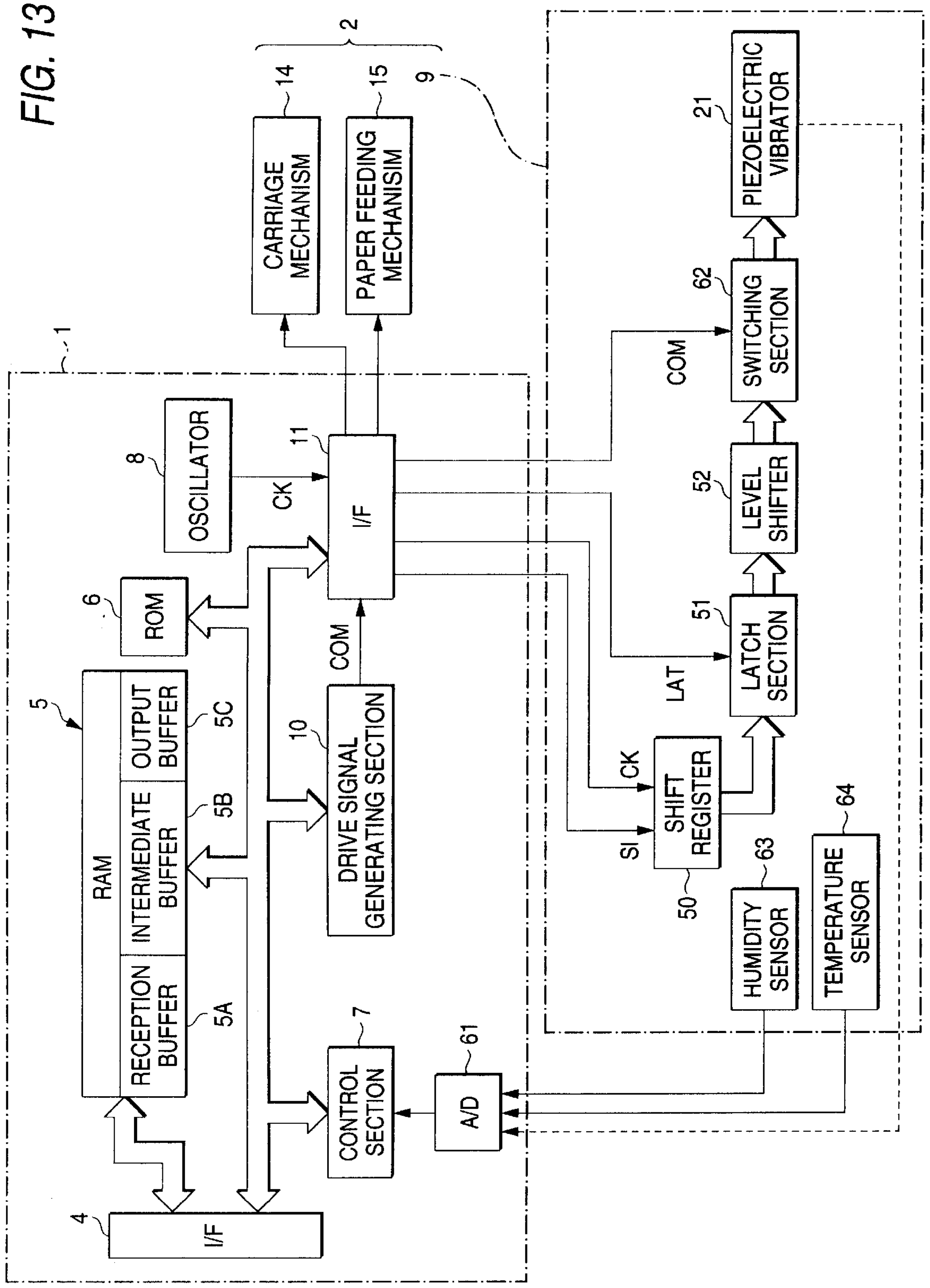
FIG. 13 is a block diagram to describe the general configuration of an ink jet recording apparatus in a fourth embodiment of the invention.

As shown in FIG. 13, an ink jet recording apparatus of the fourth embodiment is also made up of a printer controller 1 and a print engine 2. The parts identical with those previously described with reference to the figures are denoted by the same reference numerals in FIG. 13. The fourth embodiment differs from the first to third embodiments in that the printer controller 1 is provided with an A/D converter 61 for converting a detection signal, etc., from a sensor, etc., into digital data and outputting the digital data to a control section 7, that a recording head 9 comprises shift registers 50 (50A to 50N), latch sections 51 (51A to 51N), level shifters 52 (52A to 52N), switching sections 62 (62A to 62N), and piezoelectric vibrators 21 (21A to 21N), and that the recording head 9 is provided with a humidity sensor 63 and a temperature sensor 64 functioning as an environmental information acquirer. The switching section 62 has the same function as the first supply switch 53 in the described embodiments.

In the fourth embodiment, a drive signal generating section 10 functions as an initial potential setter (namely, a potential difference compensator) in the invention and a pair of the control section 7 and the drive signal generating section 10 functions as an initial potential adjuster and a drive signal generator. A set of the shift register 50, the latch section 51, the level shifter 52, and the switching section 62 functions as a waveform element supplier.

Figure 14:
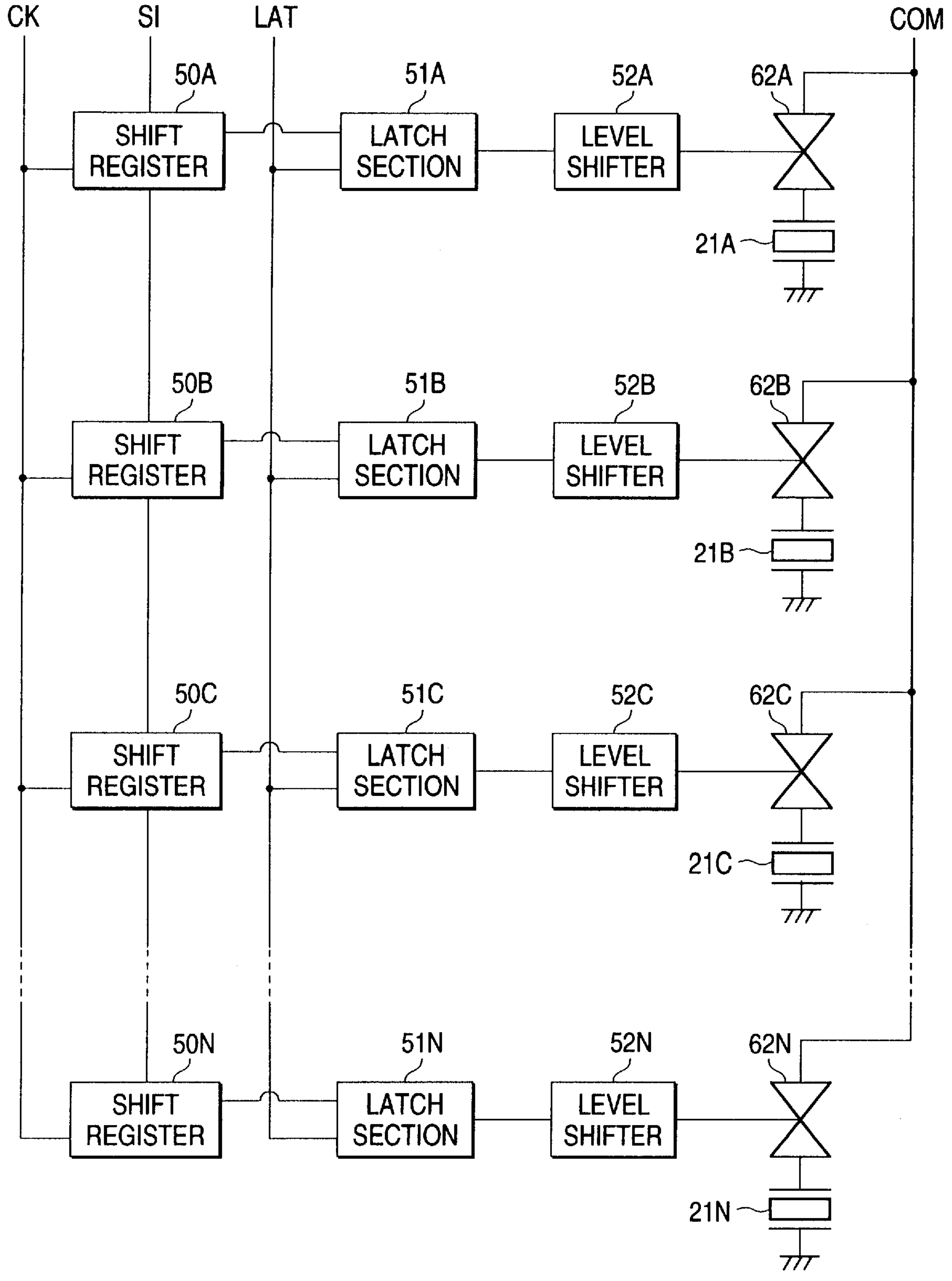
FIG. 14 is a block diagram to describe the electrical configuration of a recording head in the fourth embodiment.

As shown in FIG. 14, the shift registers 50, the latch sections 51, the level shifters 52, the switching sections 62, and the piezoelectric vibrators 21 are shift registers 50A to 50N, latch sections 51A to 51N, level shifters 52A to 52N, switching sections 62A to 62N, and piezoelectric vibrators 21A to 21N provided in a one-to-one correspondence with nozzle orifices 20; the shift register 50, the latch section 51, the level shifter 52, the switching section 62, and the piezoelectric vibrator 21 are electrically connected in order.

The humidity sensor 63 detects humidity in the surroundings of the recording head 9 and outputs a detection signal (namely, humidity information) to the A/D converter 61. Likewise, the temperature sensor 64 detects temperature in the surroundings of the recording head 9 and outputs a detection signal (namely, temperature information) to the A/D converter 61. The detection signals from the humidity sensor 63 and the temperature sensor 64 correspond to environmental information in the invention.

Figure 15:
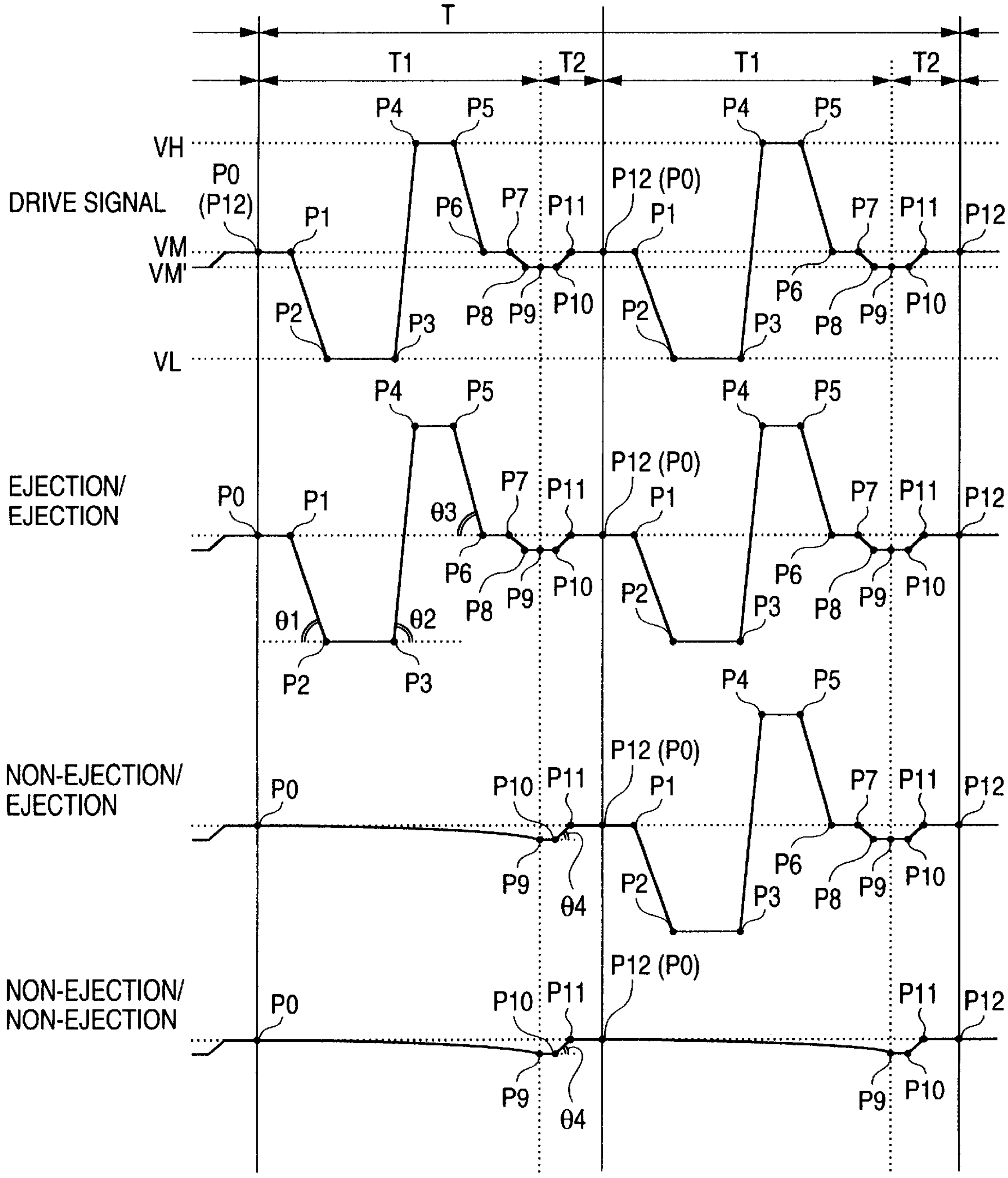
FIG. 15 is a drawing to show a drive signal, etc., in the fourth embodiment.

Next, control for supplying a drive signal to the recording head 9 (piezoelectric vibrator 21) will be discussed. FIG. 15 is a drawing to show the waveform of the drive signal COM generated by the drive signal generator (drive signal generating section 10 and control section 7). The drive signal illustrated in FIG. 15 is a signal sequence capable of jetting an ink drop through the nozzle orifice 20. The drive signal generator generates the drive signal, for example, in a 7.2-kHz print period T.

The shift register 50, the latch section 51, the level shifter 52, and the switching section 62 (namely, the waveform element supplier) select a necessary waveform element from a drive signal sequence and supply the selected waveform element to the piezoelectric vibrator 21, whereby jetting and non-jetting an ink drop is controlled for each nozzle orifice 20.

A procedure of selecting a necessary waveform element from the drive signal and supplying the selected waveform element to the piezoelectric vibrator 21 will be discussed in detail. The drive signal shown in FIG. 15 is divided into a first waveform element in time T1 (P0 to P9) and a second waveform element in time T2 (P9 to P12).

The first waveform element is a waveform element for jetting an ink drop. To jet an ink drop, the waveform element supplier selects the first waveform element; to eject no ink drop, the waveform element supplier does not select the first waveform element.

The second waveform element is a waveform element for charging the piezoelectric vibrator 21 to compensate for the potential dropped due to discharge, and is selected by the waveform element supplier regardless of whether or not an ink drop is to be jetted. This means that the second waveform element is supplied in batch to all piezoelectric vibrators 21 by the shift register 50, the latch section 51, the level shifter 52, and the switching section 62 functioning as a compensation element collective supplier in the invention.

The first waveform element (P0 to P9) contains a filling waveform element, an ejection waveform element, and a damping waveform element.

The filling waveform element is an element for causing the piezoelectric vibrator 21 to operate so as to expand a pressure generating chamber 22 for filling the pressure generating chamber 22 with ink; the portion of P1 to P3 in the first waveform element corresponds to the filling waveform element. The ejection waveform element is an element for deforming the piezoelectric vibrator 21 so as to eject ink through the nozzle orifice 20 by rapidly contracting the pressure generating chamber 22; the portion of P3 to P5 in the first waveform element corresponds to the ejection waveform element. The damping waveform element is an element for restraining waving of a meniscus in a short time just after an ink drop is jetted. The meniscus means a curved surface of ink (free surface) in the nozzle orifice 20. In the drive signal, the portion of P5 and P6 in the first waveform element corresponds to the damping waveform element.

The waveform element supplier selects the first waveform element based on one-bit print data. For example, if the print data is "1," the first waveform element is selected and a waveform signal comprising the first and second waveform elements connected in series is supplied to the piezoelectric vibrator 21.

On the other hand, if the print data is "0," the first waveform element is not selected and only the second waveform element is supplied to the piezoelectric vibrator 21.

The second waveform element (P9 to P12) contains a compensation element. The compensation element is an element for compensating for the potential dropped due to natural discharge, etc.; it charges the piezoelectric vibrator 21. In the embodiment, the part of P10 and P11 in the second waveform element corresponds to the compensation element.

The initial potential of the second waveform element (potential at P9) is set to compensation intermediate potential VM' slightly lower than intermediate potential VM as reference potential to correspond to a drop in the potential of the piezoelectric vibrator 21.

That is, the second waveform element is selected regardless of whether or not an ink drop is to be jetted and to eject no ink drop, the second waveform element in the current print period T (corresponding to the subsequent waveform element in the invention) is paired with the second waveform element in the previous print period T (corresponding to the previous waveform element in the invention). That is, when supply of the second waveform element terminates in the previous print period T, the switching section 62 is switched to a disconnection state, stopping supply of waveform element to the piezoelectric vibrator 21. The potential of the piezoelectric vibrator 21 is the intermediate potential VM of the termination potential of the second waveform element (potential at P12) when supply of the second waveform element terminates, but gradually drops with the passage of time because of natural discharge, etc.

Then, the drive signal generating section 10 (the initial potential setter) sets the initial potential of the second waveform element to the compensation intermediate potential VM' lower than the intermediate potential VM by the potential drop of the piezoelectric vibrator 21, whereby a rapid change in the potential just after supply of the second waveform element in the current print period T is started can be prevented. Thus, rapid deformation of the piezoelectric vibrator 21 can be prevented, ink drops can be prevented from being jetted in error, and destroying of the piezoelectric vibrator 21 can be prevented. Therefore, the reliability of the recording apparatus can be enhanced.

The compensation intermediate potential VM' of the initial potential of the second waveform element is set based on measurement, for example. That is, the environmental conditions of temperature, humidity, etc., are changed variously, variations in the potential drop of the piezoelectric vibrator 21 are measured, and the compensation intermediate potential VM' is set to a roughly intermediate value in the range of the variations.

In the embodiment, the potential difference between the intermediate potential VM and the compensation intermediate potential VM', the potential drop of the piezoelectric vibrator 21, is set to about 10% of the intermediate potential VM.

Next, the operation of the recording head 9 when an ink drop is jetted, namely, the operation of the recording head 9 when the first waveform element is selected and the ejection waveform of the ink drop is supplied to the piezoelectric vibrator 21 will be discussed with reference to ejection/ejection waveform in FIG. 15.

To jet the ink drop, the first and second waveform elements in the drive signal are supplied to the piezoelectric vibrator 21 in succession. Therefore, with the ejection waveform, first the intermediate potential VM is held for a predetermined time (P0 to P1). The potential is dropped with a predetermined potential gradient θ1 from the intermediate potential VM (P1 to P2) and when the minimum potential VL is reached, it is held for a predetermined time (P2 to P3). After the minimum potential VL is held for the predetermined time, the voltage is raised rapidly from the minimum voltage VL to the maximum voltage VH along a potential gradient θ2 set to a steep gradient (P3 to P4) and the maximum potential VH is held for a predetermined time (P4 to P5). After the maximum potential VH is held for the predetermined time, the voltage is dropped along a potential gradient θ3 and is restored to the intermediate potential VM (PS to P6). Then, the potential is dropped gently to the compensation intermediate potential VM' (P7 to P8) and the compensation intermediate potential VM' is held for a predetermined time (P8 to P10), then is raised gently and is restored to the intermediate potential VM (P10 to P11).

In the ejection waveform, the potential gradients θ1 and θ3 are set each to a gradient to such an extent that an ink drop is not jetted.

The ejection waveform is supplied to the piezoelectric vibrator 21, whereby the potential is changed and the piezoelectric vibrator 21 becomes deformed. As the piezoelectric vibrator 21 becomes deformed, the volume of the pressure generating chamber 22 changes, jetting an ink drop.

That is, when the ejection waveform is supplied, the piezoelectric vibrator 21 holds the intermediate potential VM for the predetermined time (P0 to P1) following the second waveform element in the previous print period T. The filling waveform element (P1 to P3) is supplied to the piezoelectric vibrator 21, whereby the potential is dropped from the intermediate potential VM to the minimum potential VL and the minimum potential VL is held. As the potential is changed, the piezoelectric vibrator 21 becomes deformed and the pressure generating chamber 22 is expanded from the reference volume corresponding to the intermediate potential VM to the maximum volume corresponding to the minimum potential VL and the maximum volume is maintained for the predetermined time.

Next, the ejection waveform element (P3 to P5) is supplied and the potential is raised rapidly from the minimum potential VL to the maximum potential VH. As the potential is changed, the piezoelectric vibrator 21 becomes deformed and the pressure generating chamber 22 is contracted rapidly from the maximum volume to the minimum volume. As the pressure generating chamber 22 is contracted, the ink pressure in the pressure generating chamber 22 is raised, jetting an ink drop through the nozzle orifice 20.

Subsequently, the damping waveform element (P5 to P6) is supplied, whereby the potential is restored from the maximum potential VH to the intermediate potential VM. As the potential is changed, the piezoelectric vibrator 21 becomes deformed and the pressure generating chamber 22 is expanded to the reference volume (corresponding to the intermediate potential VM) so as to freeze waving of a meniscus in a short time. If the damping waveform element is supplied, fine expansion element (P7 to P8) and compensation element (P9 to P10) are supplied to the piezoelectric vibrator 21 in order.

Next, the operation of the recording head 9 when no ink drop is jetted, namely, the operation of the recording head 9 when the first waveform element is not selected and the non-ejection waveform of the ink drop is supplied to the piezoelectric vibrator 21 will be discussed with reference to non-ejection/non-ejection waveform in FIG. 15. The portion of P0 to P9 in the non-ejection/non-ejection waveform is the potential.

With the non-ejection waveform, only the second waveform element of the drive signal is supplied selectively to the piezoelectric vibrator 21. Therefore, in the non-ejection waveform, first the compensation intermediate potential VM' is held for a predetermined time (P9 to P10) and the potential is raised from the compensation intermediate potential VM' to the intermediate potential VM along a potential gradient θ4 gently set (P10 to P11). When the intermediate potential VM is reached, it is held (P11 to P12).

The non-ejection waveform is supplied to the piezoelectric vibrator 21, whereby the potential is changed, but the volume of the pressure generating chamber 22 does not change and no ink drop is jetted.

That is, the waveform element supply to the piezoelectric vibrator 21 is cut off at the termination (P12) of the second waveform element in the previous print period T (corresponding to the previous waveform element in the invention). The supply cut-off state continues until the start end (P9) of the second waveform element in the current print period T (corresponding to the subsequent waveform element in the invention) comes. Supply of the second waveform element to the piezoelectric vibrator 21 is started at the start end (P9).

Since the initial potential of the second waveform element (potential at P9) is set to the compensation intermediate potential VM' lower than the intermediate potential VM, the termination potential of the second waveform element in the previous print period T (potential at P12), by the potential drop of the piezoelectric vibrator 21 as described above, the potential dropped in the supply period of no waveform element (P0 to P9) and the initial potential of the second waveform element can be matched with each other just after supply of the second waveform element is started.

Thus, a rapid change in the potential just after supply of the second waveform element is started can be prevented. Therefore, rapid deformation of the piezoelectric vibrator 21 can be prevented.

When the second waveform element is supplied, in the piezoelectric vibrator 21, first the compensation intermediate potential VM' is held for the predetermined time (P9 to P10). Then, the compensation element (P10 to P11) is supplied and the potential is restored to the intermediate potential VM, which is then held for the predetermined time (P11 to P12).

As the compensation element is supplied, the potential is restored from the compensation intermediate potential VM' to the intermediate potential VM, but the potential change amount from the compensation intermediate potential VM' to the intermediate potential VM is small and the potential gradient θ4 of the compensation element is also very gentle. Thus, the deformation amount of the piezoelectric vibrator 21 is extremely small and moreover the piezoelectric vibrator 21 becomes deformed comparatively slowly. Therefore, the pressure in the pressure generating chamber 22 little varies and no ink drop is jetted.

Thus, in the embodiment, the compensation element (P10 to P11) is contained in the second waveform element in the current print period T which becomes the subsequent waveform element. Using the compensation element, the potential is restored to the intermediate potential VM of the termination potential of the second waveform element in the current print period T (previous waveform element).

This operation can compensate for the drop of the potential. Since the intermediate potential VM is the same potential as the start end of the first waveform element in the following print period (namely, connection end of waveform element connected), connection to the start end of the first waveform element can be made smoothly.

In short, in the embodiment, in expectation of the potential drop in the non-supply period in which no waveform element is supplied, the initial potential of the subsequent waveform element (initial potential of the second waveform in the current print period T) is set lower than the termination potential of the previous waveform element (termination potential of the second waveform in the previous print period T), whereby when the subsequent waveform element is supplied to the piezoelectric vibrator 21, the difference between the waveform element potential and the potential can be made extremely small.

Thus, a rapid potential rise of the piezoelectric vibrator 21 just after supply of the subsequent waveform element is started can be prevented, ink drops can be prevented from being jetted in error, and destroying of the piezoelectric vibrator 21 can also be prevented.

By the way, the potential drop in the supply period of no drive signal changes depending on the environment of temperature, humidity, etc., and the potential largely drops under the condition of high temperature and high humidity.

Focusing attention on this point, the control section 7 (initial potential adjuster) may adjust the initial potential of the subsequent waveform element (potential at P9, namely, compensation intermediate potential VM') and the drive signal generating section 10 may generate a drive signal with the initial potential adjusted.

For example, the control section 7 recognizes the humidity and temperature in the surroundings of the recording head 9 based on humidity information from the humidity sensor 63 and temperature information from the temperature sensor 64. It references table data stored in ROM 6 based on the recognized humidity and temperature, and sets the initial potential in the subsequent waveform element.

Thus, the initial potential fitted to the drop in the potential changed in response to the humidity and temperature in the surroundings of the recording head 9 can be set. Therefore, a rapid potential rise of the piezoelectric vibrator 21 just after supply of the subsequent waveform element is started can be prevented reliably.

In the embodiment, the compensation element collective supplier contained in the waveform element supplier is made up of the shift register 50, the latch section 51, the level shifter 52, and the switching section 62 by way of example. However, the compensation element collective supplier may be implemented as a separate circuit from the shift register 50, the latch section 51, the level shifter 52, and the switching section 62.

Next, a fifth embodiment of the invention will be discussed. In the fifth embodiment, a large ink drop or a medium ink drop is selectively jetted in one print period T. That is, a large dot drive signal for jetting a large ink drop or a medium dot drive signal for jetting a medium ink drop is selectively supplied to a piezoelectric vibrator 21. Also in the embodiment, the large ink drop is an ink drop having a volume of about 20 pL and the medium ink drop is an ink drop having a volume of about 8 pL as in the third embodiment.

Figure 16:
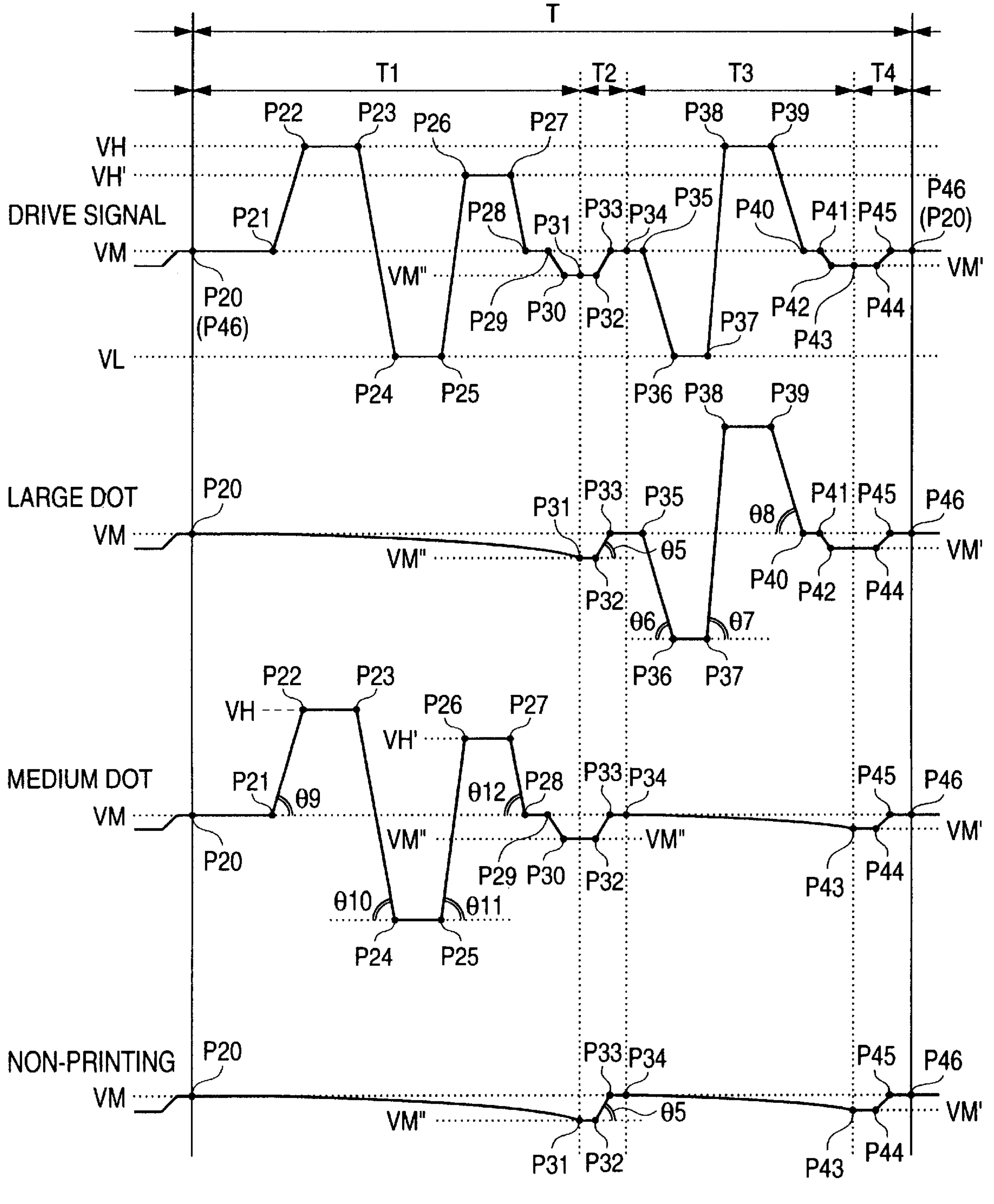
FIG. 16 is a drawing to show a drive signal, etc., in a fifth embodiment of the invention.

FIG. 16 is a drawing to show the waveform of a drive signal generated by a drive signal generator (a drive signal generating section 10 and a control section 7). The drive signal illustrated in FIG. 16 is a signal sequence capable of jetting a large ink drop and a medium ink drop through a single nozzle orifice 20; a waveform element capable of jetting a large ink drop is preceded by a waveform element capable of jetting a medium ink drop. Other components are identical with those of the ink jet recording apparatus of the fourth embodiment.

In the embodiment, the drive signal generator generates the drive signal, for example, in a 7.2-kHz print period T. A waveform element supplier (a shift register 50, a latch section 51, a level shifter 52, and a switching section 62) selects a necessary waveform element from a drive signal sequence and supplies the selected waveform element to the piezoelectric vibrator 21. This means that a large dot drive signal capable of jetting a large ink drop and a medium dot drive signal for jetting a medium ink drop are supplied to the piezoelectric vibrator 21.

A procedure of supplying a necessary waveform element from the drive signal to the piezoelectric vibrator 21 will be discussed in detail.

The drive signal shown in FIG. 16 is divided into a first waveform element in time T1 (P20 to P31), a second waveform element in time T2 (P31 to P34), a third waveform element in time T3 (P34 to P43), and a fourth waveform element in time T4 (P43 to P46). The first waveform element, the second waveform element, the third waveform element, and the fourth waveform element are connected in order in series. The start end of the first waveform element (P20) is the termination of the fourth waveform element (P46) in the previous print period and the termination of the fourth waveform element (P46) is the start end of the first waveform element (P20) in the following print period.

The waveform element supplier selects the second, third, and fourth waveform elements, whereby the large dot drive signal is supplied to the piezoelectric vibrator 21. The waveform element supplier selects the first, second, and fourth waveform elements, whereby the medium dot drive signal is supplied to the piezoelectric vibrator 21.

The first and third waveform elements are waveform elements for jetting ink drops. More particularly, the first waveform element is a waveform element selected to eject a medium ink drop and the third waveform element is a waveform element selected to eject a large ink drop.

The second and fourth waveform elements are waveform elements for charging the piezoelectric vibrator 21 to compensate for the potential dropped due to discharge, and are selected by the waveform element supplier regardless of whether or not an ink drop is to be jetted. This means that the second and fourth waveform elements are supplied in batch to all piezoelectric vibrators 21 by the waveform element supplier (a compensation element collective supplier).

The waveform element supplier selects waveform elements based on two-bit print data. That is, the high-order bit of the print data is made to correspond to the first waveform element of the time T1 and the low-order bit of the print data is made to correspond to the third waveform element of the time T3.

The waveform element supplier selects the second, third, and fourth waveform elements based on the print data set to "01" and supplies a large dot drive signal to the piezoelectric vibrator 21. That is, a switching section 62 is placed in a connection state at the timing at which the start end of the second waveform element (P31) in the drive signal comes, and this connection state is maintained until the termination of the fourth waveform element (P46), whereby the large dot drive signal is supplied.

Likewise, the waveform element supplier selects the first, second, and fourth waveform elements based on the print data set to "10" and supplies a medium dot drive signal to the piezoelectric vibrator 21. That is, the switching section 62 is placed in a connection state from the start end of the first waveform element (P20) in the drive signal, and is placed in a disconnection state at the timing at which the termination of the second waveform element (P34) comes. Then, the switching section 62 is again placed in the connection state at the timing at which the start end of the fourth waveform element (P43) comes, and this connection state is maintained until the termination of the fourth waveform element (P46), whereby the medium dot drive signal is supplied.

To jet no ink drop through the nozzle orifice 20, the print data is set to "00." If the print data is thus set to "00," the waveform element supplier selects the second and fourth waveform elements and supplies the waveform elements to the piezoelectric vibrator 21. That is, the switching section 62 is placed in a connection state from the start end of the second waveform element (P31) in the drive signal, and is placed in a disconnection state at the timing at which the termination of the second waveform element (P34) comes. Then, the switching section 62 is again placed in the connection state at the timing at which the start end of the fourth waveform element (P43) comes, and this connection state is maintained until the termination of the fourth waveform element (P46).

Next, the waveform elements making up the drive signal will be discussed. The drive signal shown in FIG. 16 contains a contraction waveform element, a filling waveform element, an ejection waveform element, a damping waveform element, and a compensation element.

The contraction waveform element is an element for deforming the piezoelectric vibrator 21 so as to contract a pressure generating chamber 22 to such an extent that an ink drop is not jetted.

In the drive signal, the portion of P21 to P23 in the first waveform element corresponds to the contraction waveform element. A first filling waveform element of P23 to P25 in the first waveform element and a second filling waveform element of P35 to P37 in the third waveform element correspond to the filling waveform element. A first ejection waveform element of P25 to P27 in the first waveform element and a second ejection waveform element of P37 to P39 in the third waveform element correspond to the ejection waveform element. A first damping waveform element of P27 to P28 in the first waveform element and a second damping waveform element of P39 to P40 in the third waveform element correspond to the damping waveform element. A first compensation element of P32 to P33 in the second waveform element and a second compensation element of P44 to P45 in the fourth waveform element correspond to the compensation element.

In the embodiment, the initial potential of the fourth waveform element (potential at P43) is set to compensation intermediate potential VM' slightly lower than intermediate potential VM and the initial potential of the second waveform element (potential at P31) is set to second compensation intermediate potential VM" slightly lower than the compensation intermediate potential VM' to correspond to a drop in the potential of the piezoelectric vibrator 21. The second or fourth waveform element is always selected. That is, the second waveform element is selected unless the first waveform element is selected, and the fourth waveform element is selected unless the third waveform element is selected.

If the first waveform element is not selected, the second waveform element (corresponding to the subsequent waveform element in the invention) is paired with the fourth waveform element in the previous print period T (corresponding to the previous waveform element in the invention). That is, when supply of the fourth waveform element terminates in the previous print period T, the switching section 62 is switched to a disconnection state, stopping supply of waveform element to the piezoelectric vibrator 21. The potential of the piezoelectric vibrator 21 is the intermediate potential VM of the termination potential of the fourth waveform element (potential at P20, namely, P46) when supply of the fourth waveform element terminates; in fact, however, it gradually drops with the passage of time because of natural discharge, etc.

Then, the initial potential of the second waveform element is set to the second compensation intermediate potential VM" lower than the intermediate potential VM by the potential drop of the piezoelectric vibrator 21, whereby a rapid change in the potential just after supply of the second waveform element is started can be prevented.

Likewise, if the third waveform element is not selected, the fourth waveform element (corresponding to the subsequent waveform element in the invention) is paired with the second waveform element in the same print period T (corresponding to the previous waveform element in the invention). That is, when supply of the second waveform element terminates, the switching section 62 is switched to a disconnection state, stopping supply of the drive signal to the piezoelectric vibrator 21. The potential of the piezoelectric vibrator 21 is the intermediate potential VM of the termination potential of the second waveform element (potential at P34) when supply of the second waveform element terminates; in fact, however, it gradually drops with the passage of time because of natural discharge, etc.

Then, the initial potential of the fourth waveform element is set to the compensation intermediate potential VM' lower than the intermediate potential VM by the potential drop of the piezoelectric vibrator 21, whereby a rapid change in the potential just after supply of the fourth waveform element is started can be prevented.

Next, the large dot drive signal made up of the described waveform elements will be discussed. The portion of P20 to P31 in the large dot drive signal in FIG. 16 indicates the potential of the potential of the piezoelectric vibrator 21.

With the large dot drive signal, the second compensation intermediate potential VM" is held for a predetermined time (P31 to P32) and the potential is restored to the intermediate potential VM along a potential gradient θ5 gently set from the second compensation intermediate potential VM" (P32 to P33) and the intermediate potential VM is held for a predetermined time (P33 to P35).

After the intermediate potential VM is held for the predetermined time, the potential is dropped along a predetermined potential gradient θ6 (P35 to P36) and when the minimum voltage VL is reached, it is held for a predetermined time (P36 to P37). After the minimum voltage VL is held for the predetermined time, the voltage is raised from the minimum voltage VL to the maximum voltage VH along a potential gradient θ7 set to a steep gradient (P37 to P38) and the maximum potential VH is held for a predetermined time (P38 to P39). After the maximum potential VH is held for the predetermined time, the voltage is dropped along a potential gradient θ8 and is restored to the intermediate potential VM (P39 to P40). Then, the potential is dropped gently to the compensation intermediate potential VM' (P41 to P42) and the compensation intermediate potential VM' is held for a predetermined time (P42 to P44), then the potential is raised gently and is restored to the intermediate potential VM (P44 to P45).

In the large dot drive signal, the potential gradients θ5, θ6, and θ8 are set each to a gradient to such an extent that an ink drop is not jetted.

The large dot drive signal is supplied, whereby the piezoelectric vibrator 21 is charged and discharged and becomes deformed. As the piezoelectric vibrator 21 becomes deformed, the volume of the pressure generating chamber 22 changes, jetting a large ink drop.

That is, to the piezoelectric vibrator 21 having the potential set to the intermediate potential VM at the termination of the fourth waveform element (P46) in the previous print period T, waveform element supply is cut off from the start of the current print period T. Thus, the potential drops gradually with the passage of time. Then, the second waveform element is supplied to the piezoelectric vibrator 21 from the start end P31 of the second waveform element. Since the initial potential of the second waveform element (potential at P31) is set to the second compensation intermediate potential VM", the difference between the potential and the initial potential of the second waveform element can be eliminated or can be made extremely small. Therefore, a rapid rise in the potential when supply of the second waveform element is started can be prevented.

The first compensation element (P32 to P33) is supplied, whereby the potential is restored from the second compensation intermediate potential VM" to the intermediate potential VM. Subsequently, the second filling waveform element (P35 to P37) is supplied, whereby the potential is dropped from the intermediate potential VM to the minimum potential VL and the minimum potential VL is held. As the potential is changed, the piezoelectric vibrator 21 becomes deformed and the pressure generating chamber 22 is expanded from the volume corresponding to the compensation intermediate potential VM' and maintains the maximum volume corresponding to the minimum potential VL for a predetermined time. Next, the second ejection waveform element (P37 to P39) is supplied and the potential is raised rapidly from the minimum potential VL to the maximum potential VH. As the potential is changed, the piezoelectric vibrator 21 becomes deformed and the pressure generating chamber 22 is contracted rapidly from the maximum volume to the minimum volume and the ink pressure in the pressure generating chamber 22 is raised, jetting a large ink drop.

Subsequently, the second damping waveform element (P39 to P40) is supplied, whereby the potential is restored from the maximum potential VH to the intermediate potential VM. As the potential is changed, the piezoelectric vibrator 21 becomes deformed and the pressure generating chamber 22 is expanded to the reference volume (corresponding to the intermediate potential VM) so as to freeze waving of a meniscus in a short time. If the second damping waveform element is supplied, fine expansion element (P41 to P43) and second compensation element (P44 to P45) are supplied to the piezoelectric vibrator 21 in order.

Next, the medium dot drive signal will be discussed. The portion of P34 to P43 in the medium dot drive signal in FIG. 16 indicates the potential of the potential of the piezoelectric vibrator 21.

With the medium dot drive signal, the potential is raised with a predetermined potential gradient θ9 from the intermediate potential VM (P21 to P22) and when the maximum potential VH is reached, it is held for a predetermined time (P22 to P23). After the maximum potential VH is held for the predetermined time, the potential is dropped to the minimum potential VL with a predetermined potential gradient θ10 from the maximum potential VH and the minimum potential VL is held (P23 to P25). The potential is raised to the second maximum potential VH' set slightly lower than the maximum voltage VH along a potential gradient θ11 set to a steep gradient (P25 to P26). The second maximum potential VH' is maintained for a predetermined time (P26 to P27) and the potential is dropped to the intermediate potential VM along a predetermined potential gradient θ12 (P27 to P29). After the potential is dropped to the intermediate potential VM, it is dropped gently to the second compensation intermediate potential VM" (P29 to P30) and the second compensation intermediate potential VM" is held for a predetermined time (P30 to P32), then the potential is raised gently and is restored to the intermediate potential VM (P32 to P33). The waveform element supply to the piezoelectric vibrator 21 is cut off at the termination of the second waveform element (P34).

Then, the waveform element supply is restarted at the start end of the fourth waveform element (P43) and the compensation intermediate potential VM' is held over a predetermined time from the start end (P43 to P44), then the potential is raised gently and is restored to the intermediate potential VM (P44 to P45). In the medium dot drive signal, the potential gradients θ9, θ10, and θ12 are set each to a gradient to such an extent that an ink drop is not jetted.

The medium dot drive signal is supplied, whereby the piezoelectric vibrator 21 is charged and discharged and becomes deformed, jetting a medium ink drop. That is, contraction waveform element (P21 to P23) is supplied, whereby the potential is raised from the intermediate potential VM to the maximum potential VH and the maximum potential VH is held. As the potential is changed, the piezoelectric vibrator 21 becomes deformed and the pressure generating chamber 22 is contracted from the reference volume corresponding to the intermediate potential VM and maintains the minimum volume corresponding to the minimum potential VH for a predetermined time.

Next, the first filling waveform element (P23 to P25) is supplied and the potential is dropped from the maximum potential VH to the minimum potential VL and the minimum potential VL is held. As the potential is changed, the piezoelectric vibrator 21 becomes deformed and the pressure generating chamber 22 is expanded from the minimum volume to the maximum volume and maintains the expansion state. As the pressure generating chamber 22 is expanded, the inside of the pressure generating chamber 22 becomes negative pressure, pulling a meniscus into the pressure generating chamber 22. Next, the first ejection waveform element (P25 to P27) is supplied and the potential is raised rapidly from the minimum potential VL to the second maximum potential VH' and the second maximum potential VH' is maintained for a predetermined time. As the potential is changed, the piezoelectric vibrator 21 becomes deformed and the pressure generating chamber 22 is contracted rapidly from the maximum volume to the volume corresponding to the second maximum potential VH'. As the pressure generating chamber 22 is contracted, the ink pressure in the pressure generating chamber 22 is raised, jetting a medium ink drop through the nozzle orifice 20.

Subsequently, the first damping waveform element (P27 to P28) is supplied and the potential is restored from the second maximum potential VH' to the intermediate potential VM. As the potential is changed, the piezoelectric vibrator 21 becomes deformed and the pressure generating chamber 22 is expanded to the reference volume (corresponding to the intermediate potential VM) so as to freeze waving of a meniscus in a short time. If the first damping waveform element is supplied, fine expansion element (P29 to P30) and first compensation element (P32 to P33) are supplied to the piezoelectric vibrator 21 in order and the potential is dropped gently to the second compensation intermediate potential VM", then is restored to the intermediate potential VM. Since the potential change amount is small and the potential change is gentle, the pressure change in the pressure generating chamber 22 is little affected. The intermediate potential VM is maintained for a short time (P33 to P34) and then supply of the drive signal is cut off (P34 to P43). As supply of the drive signal is cut off, the potential is dropped gradually with the passage of time.

The drive signal is supplied to the piezoelectric vibrator 21 from the start end P43 of the fourth waveform element. Since the initial potential of the fourth waveform element (potential at P43) is set to the compensation intermediate potential VM', the difference between the potential and the initial potential of the fourth waveform element can be eliminated or can be made extremely small. Therefore, a rapid rise in the potential when supply of the fourth waveform element is started can be prevented. The compensation intermediate potential VM' is held over a predetermined time (P43 to P44) and subsequently the second compensation element (P44 to P45) is supplied to the piezoelectric vibrator 21. Using the compensation element, the potential is restored from the compensation intermediate potential VM' to the intermediate potential VM. Then, the intermediate potential VM is held (P45 to P46).

Next, the drive signal at the non-print time will be discussed. The portion of P20 to P31 and the portion of P34 to P43 in the non-print signal in FIG. 16 indicate the potential of the potential of the piezoelectric vibrator 21.

With the non-print signal, the second compensation intermediate potential VM" is held for a predetermined time (P31 to P32) and the potential is restored to the intermediate potential VM along a potential gradient θ5 gently set from the second compensation intermediate potential VM" (P32 to P33) and the intermediate potential VM is held for a predetermined time (P33 to P34). Supply of the signal to the piezoelectric vibrator 21 is cut off at the termination of the second waveform element (P34). Then, supply of the signal is restarted at the start end of the fourth waveform element (P43) and the compensation intermediate potential VM' is held over a predetermined time from the start end (P43 to P44), then the potential is raised gently and is restored to the intermediate potential VM (P44 to P45).

The non-print signal is supplied to the piezoelectric vibrator 21, whereby the piezoelectric vibrator 21 is charged whenever necessary. As the piezoelectric vibrator 21 is charged, an excessive drop in the potential is prevented.

That is, to the piezoelectric vibrator 21 set to the intermediate potential VM at the termination of the fourth waveform element (P46) in the previous print period T, waveform element supply is cut off from the start of the current print period T. Thus, the potential drops gradually with the passage of time. Then, the second waveform element is supplied to the piezoelectric vibrator 21 from the start end P31 of the second waveform element. Since the initial potential of the second waveform element (potential at P31) is set to the second compensation intermediate potential VM", the difference between the potential and the initial potential of the second waveform element can be eliminated or can be made extremely small. Therefore, a rapid rise in the potential when supply of the second waveform element is started can be prevented.

The first compensation element (P32 to P33) is supplied, whereby the potential is restored from the second compensation intermediate potential VM" to the intermediate potential VM. Then, the waveform element supply is cut off from the termination of the second waveform element (P34). Thus, the potential again starts to drop.

Then, the fourth waveform element is supplied to the piezoelectric vibrator 21 from the start end P43 of the fourth waveform element. Since the initial potential of the fourth waveform element (potential at P43) is set to the compensation intermediate potential VM', the difference between the potential and the initial potential of the fourth waveform element can be eliminated or can be made extremely small. Therefore, a rapid rise in the potential when supply of the fourth waveform element is started can be prevented. The second compensation element (P44 to P45) is supplied, whereby the potential is restored from the compensation intermediate potential VM' to the intermediate potential VM.

Thus, in the embodiment, the compensation element is contained in the second and fourth waveform elements that can become subsequent waveform elements. The compensation element compensates for the drop of the potential.

Further, in the embodiment, the initial potential of the second waveform element (potential at P31) is set lower than the initial potential of the fourth waveform element (potential at P43), because the potential drop amount varies depending on the length of the non-supply period of the drive signal. This means that the longer the non-supply period, the larger the potential drop amount. Comparing the non-supply period corresponding to the second waveform element (P20 to P31) with the non-supply period corresponding to the fourth waveform element (P34 to P43), the former is longer than the latter, thus the initial potential of the second waveform element is set lower than the initial potential of the fourth waveform element.

The non-supply period corresponding to the second waveform element (P20 to P31) is made longer to provide a sufficient standby time preceding the third waveform element for jetting a large ink drop. In doing so, the time required for one print period T can be shortened and the record speed can be increased.

In short, the control section 7 (initial potential adjuster) in the embodiment sets the initial potential of the subsequent waveform element so that the difference between the termination potential of the previous waveform element and the initial potential of the subsequent waveform element becomes larger as the time between the termination of the previous waveform element and the start end of the subsequent waveform element is longer, and causes the drive signal generating section 10 to generate the drive signal thus set.

In the configuration, the optimum initial potential is set in response to the length of the non-supply period of the drive signal, so that the disadvantage that the potential of the piezoelectric vibrator 21 rises rapidly just after supply of the subsequent waveform element is started can be prevented more reliably.

Next, a sixth embodiment of the invention will be discussed. In the sixth embodiment, a medium dot drive signal for jetting a medium ink drop and a small dot drive signal for jetting a small ink drop are supplied to a piezoelectric vibrator 21. More particularly, the waveform elements making up the small dot drive signal are divided in a duration direction and the waveform elements making up the medium dot drive signal are mixed in the provided waveform elements for making up a drive signal sequence.

The small ink drop means an ink drop having an ink volume of about 4 pL (picoliters). When the small ink drop is deposited, a small dot is formed on recording paper.

Figure 17:
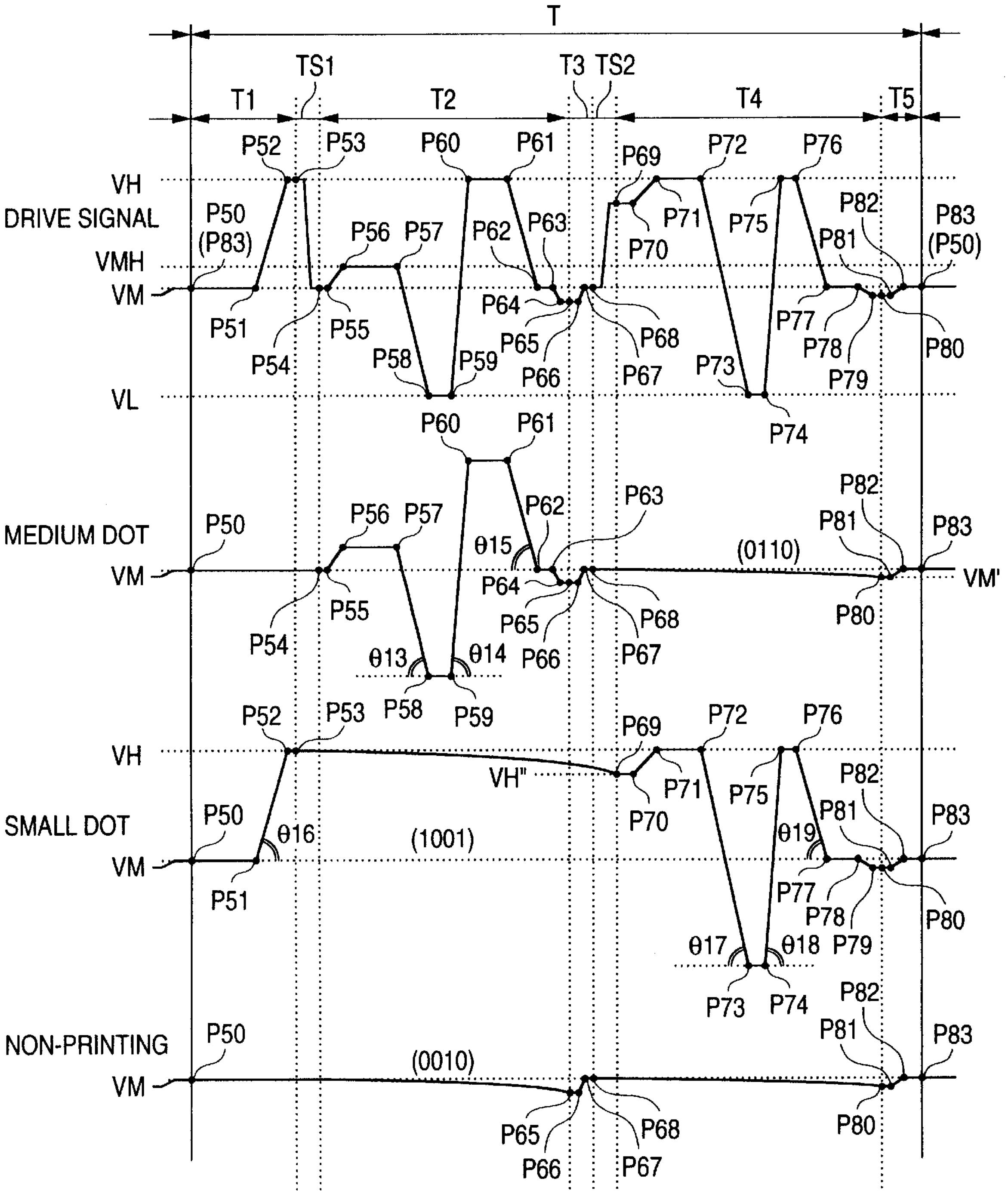
FIG. 17 is a drawing to show a drive signal, etc., in a sixth embodiment of the invention.

FIG. 17 is a drawing to show the waveform of a drive signal generated by a drive signal generator (a drive signal generating section 10 and a control section 7). The drive signal illustrated in FIG. 17 is a signal sequence capable of jetting a medium ink drop and a small ink drop through a single nozzle orifice 20. Other components are identical with those of the ink jet recording apparatus of the fourth embodiment.

In the embodiment, a shift register 50, a latch section 51, a level shifter 52, and a switching section 62, namely, a waveform element supplier selects a necessary waveform element from a drive signal sequence and supplies a medium dot drive signal and a small dot drive signal to the piezoelectric vibrator 21.

The drive signal shown in FIG. 17 is divided into a first waveform element in time T1 (P50 to P53), a second waveform element in time T2 (P54 to P65), a third waveform element in time T3 (P65 to P68), a fourth waveform element in time T4 (P69 to P80), a fifth waveform element in time T5 (P80 to P83), a first connection element in time TS1 (P53 to P54), and a second connection element in time TS2 (P68 to P69). The first waveform element, the first connection element, the second waveform element, the third waveform element, the second connection element, the fourth waveform element, and the fifth waveform element are connected in order in series. The connection element is an element for connecting different potentials of the waveform elements without causing the piezoelectric vibrator 21 to operate.

Also in the drive signal, the start end of the first waveform element (P50) corresponds to the termination of the fifth waveform element in the previous print period T and the termination of the fifth waveform element (P83) corresponds to the start end of the first waveform element in the following print period T.

The second, third, and fifth waveform elements are selected, whereby the medium dot drive signal is supplied to the piezoelectric vibrator 21. Likewise, the first, fourth, and fifth waveform elements are selected, whereby the small dot drive signal is supplied to the piezoelectric vibrator 21. The third and fifth waveform elements are waveform elements for charging the piezoelectric vibrator 21 to compensate for the potential dropped due to discharge. Further, the fifth waveform element is selected by the waveform element supplier regardless of whether or not an ink drop is to be jetted. This means that the fifth waveform element is supplied in batch to all piezoelectric vibrators 21 by the waveform element supplier (a compensation element collective supplier). The third waveform element is selected by the waveform element supplier to eject a medium ink drop and to eject no ink drop, as described later. This means that the third waveform element is supplied by the waveform element supplier (a compensation element selective supplier) to the piezoelectric vibrator 21 for jetting a medium ink drop and to the piezoelectric vibrator 21 for jetting no ink drop The waveform element supplier in the embodiment selects waveform elements based on four-bit print data. That is, the most significant bit of the print data is made to correspond to the first waveform element of the time T1, the second most significant bit of the print data is made to correspond to the second waveform element of the time T2, the third most significant bit of the print data is made to correspond to the third waveform element of the time T3, and the least significant bit of the print data is made to correspond to the fourth waveform element of the time T4.

The waveform element supplier selects the second, third, and fifth waveform elements from the drive signal based on the print data set to "0110," and supplies a medium dot drive signal to the piezoelectric vibrator 21. That is, a switching section 62 is placed in a connection state at the timing at which the start end of the second waveform element (P54) in the drive signal comes, and the switching section 62 is placed in a disconnection state at the timing at which the termination of the third waveform element (P68) comes. Then, the switching section 62 is again placed in the connection state at the timing at which the start end of the fifth waveform element (P80) comes, and this connection state is maintained until the termination of the fifth waveform element (P83), whereby the medium dot drive signal is supplied.

Likewise, the waveform element supplier selects the first, fourth, and fifth waveform elements from the drive signal based on the print data set to "1001" and supplies a small dot drive signal to the piezoelectric vibrator 21. That is, the switching section 62 is placed in a connection state from the start end of the first waveform element (P50) in the drive signal, and is placed in a disconnection state at the timing at which the termination of the first waveform element (P53) comes. Then, the switching section 62 is again placed in the connection state at the timing at which the start end of the fourth waveform element (P69) comes, and this connection state is maintained until the termination of the fifth waveform element (P83), whereby the small dot drive signal is supplied.

Likewise, the waveform element supplier selects the third and fifth waveform elements based on the print data set to "0010" and supplies a small dot drive signal to the piezoelectric vibrator 21. That is, the switching section 62 is placed in a connection state from the start end of the third waveform element (P65), and is placed in a disconnection state at the timing at which the termination of the third waveform element (P68) comes. Then, the switching section 62 is again placed in the connection state at the timing at which the start end of the fifth waveform element (P80) comes, and this connection state is maintained until the termination of the fifth waveform element (P83).

Next, the medium dot drive signal will be discussed. The portion of P50 to P54 and the portion of P68 to P80 in the medium dot drive signal in FIG. 17 indicate the potential of the potential of the piezoelectric vibrator 21.

With the medium dot drive signal, intermediate potential VM is held for a short time (P54 to P55) and the potential is raised gently from the intermediate potential VM to second intermediate potential VMH (P55 to P56). When the second intermediate potential VMH is reached, it is held for a predetermined time (P56 to P57). After the second intermediate potential VMH is held for the predetermined time, the voltage is dropped along a predetermined potential gradient θ13 from the second intermediate potential VMH to minimum voltage VL (P57 to P58) and the minimum voltage VL is held for a predetermined time (P58 to P59). After the minimum voltage VL is held for the predetermined time, the voltage is raised rapidly to maximum voltage VH along a potential gradient θ14 (P59 to P50) and the maximum potential VH is held (P60 to P61). After the maximum potential VH is held, the voltage is dropped along a potential gradient θ15 and is restored to the intermediate potential VM (P61 to P62). Then, the potential is dropped gently to second compensation intermediate potential VM" (P63 to P64) and the second compensation intermediate potential VM" is held for a predetermined time (P64 to P66), then the potential is raised gently and is restored to the intermediate potential VM (P66 to P67). The waveform element supply to the piezoelectric vibrator 21 is cut off at the termination of the third waveform element (P68).

Then, the waveform element supply is restarted at the start end of the fifth waveform element and compensation intermediate potential VM' is held over a predetermined time from the start end (P80 to P81), then the potential is raised gently and is restored to the intermediate potential VM (P81 to P82) and the intermediate potential VM is held. In the medium dot drive signal, the potential gradients θ13 and θ15 are set each to a gradient to such an extent that an ink drop is not jetted.

The medium dot drive signal is supplied, whereby the piezoelectric vibrator 21 is charged and discharged and becomes deformed, jetting a medium ink drop.

That is, fine contraction waveform element (P55 to P57) is supplied, whereby the potential is raised from the intermediate potential VM to the second intermediate potential VMH and the second intermediate potential VMH is held. As the potential is changed, the piezoelectric vibrator 21 becomes deformed and the pressure generating chamber 22 is held in a state in which it is contracted slightly from the reference volume. Next, first filling waveform element (P57 to P59) is supplied and the potential is dropped from the second intermediate potential VMH to the minimum potential VL and the minimum potential VL is held. As the potential is changed, the piezoelectric vibrator 21 becomes deformed and the pressure generating chamber 22 is expanded to the maximum volume and maintains the expansion state. As the pressure generating chamber 22 is expanded, the inside of the pressure generating chamber 22 becomes negative pressure, pulling a meniscus into the pressure generating chamber 22. Next, first ejection waveform element (P59 to P61) is supplied and the potential is raised rapidly from the minimum potential VL to the maximum potential VH and the maximum potential VH is maintained for a predetermined time. As the potential is changed, the pressure generating chamber 22 is contracted rapidly from the maximum volume to the minimum volume, jetting a medium ink drop through the nozzle orifice 20.

Subsequently, first damping waveform element (P61 to P62) is supplied and the potential is restored from the maximum potential VH to the intermediate potential VM. As the potential is changed, the pressure generating chamber 22 is expanded to the reference volume for freezing waving of a meniscus in a short time. If the first damping waveform element is supplied, fine expansion element (P63 to P64) and first compensation element (P66 to P67) are supplied to the piezoelectric vibrator 21 in order and the potential is dropped gently to the second compensation intermediate potential VM", then is restored to the intermediate potential VM. Since the potential change amount is small and the potential change is gentle, the pressure change in the pressure generating chamber 22 is little affected. The intermediate potential VM is maintained for a short time (P67 to P68) and then supply of the drive signal is cut off (P68 to P80). As supply of the drive signal is cut off, the potential is dropped gradually with the passage of time.

A waveform element is supplied to the piezoelectric vibrator 21 from the start end P80 of the fifth waveform element. Since the initial potential of the fifth waveform element (potential at P80) is set to the compensation intermediate potential VM', the difference between the potential and the initial potential of the fifth waveform element can be made extremely small. Therefore, a rapid rise in the potential when supply of the fifth waveform element is started can be prevented. If the compensation intermediate potential VM' is held over a predetermined time (P80 to P81), second compensation element (P81 to P82) is supplied to the piezoelectric vibrator 21. Using the second compensation element, the potential is restored from the compensation intermediate potential VM' to the intermediate potential VM. Then, the intermediate potential VM is held (P82 to P83).

Next, the small dot drive signal will be discussed. The portion of P53 to P69 in the small dot drive signal in FIG. 17 indicates the potential of the potential of the piezoelectric vibrator 21.

With the small dot drive signal, the potential is raised with a predetermined potential gradient θ16 from the intermediate potential VM (P51 to P52) and when the maximum potential VH is reached, it is held for a short time (P52 to P53) and waveform element supply to the piezoelectric vibrator 21 is cut off. Then, the waveform element supply is restarted at the start end of the fourth waveform element and maximum compensation potential VH" is held over a predetermined time from the start end (P69 to P70), then the potential is raised gently and is restored to the maximum potential VH (P70 to P71) and the maximum potential VH is held (H71 to H72). The potential is dropped to the minimum potential VL with a predetermined potential gradient θ17 from the maximum potential VH and the minimum potential VL is held (P72 to P74). The potential is raised to the maximum potential VH along a potential gradient θ18 set to a steep gradient (P74 to P75). The maximum potential VH is maintained for a predetermined time (P75 to P76) and the potential is dropped to the intermediate potential VM along a predetermined potential gradient θ19 (P75 to P76). Then, the potential is dropped gently to the compensation intermediate potential VM' (P78 to P79) and the compensation intermediate potential VM' is held for a predetermined time (P79 to P81), then the potential is raised gently and is restored to the intermediate potential VM (P81 to P82). In the small dot drive signal, the potential gradients θ16, θ17, and θ19 are set each to a gradient to such an extent that an ink drop is not jetted.

The small dot drive signal is supplied, whereby the piezoelectric vibrator 21 is charged and discharged and becomes deformed, jetting a small ink drop.

That is, contraction waveform element (P51 to P53) is supplied, whereby the potential is raised from the intermediate potential VM to the maximum potential VH and the maximum potential VH is held for a short time. As the potential is changed, the piezoelectric vibrator 21 becomes deformed and the pressure generating chamber 22 is contracted from the reference volume to the minimum volume.

After the contraction waveform element is supplied, the waveform element supply is cut off (P53 to P69). As the waveform element supply is cut off, the potential drops gradually with the passage of time. Waveform element is supplied to the piezoelectric vibrator 21 from the start end P69 of the fourth waveform element. Since the initial potential of the fourth waveform element (potential at P69) is set to the maximum compensation potential VM" lower than the maximum potential VH by the potential drop, the difference between the potential and the initial potential of the fourth waveform element can be made extremely small. Therefore, a rapid rise in the potential when supply of the fourth waveform element is started can be prevented.

In this case, the control section 7 (an initial potential adjuster) sets the difference between the maximum potential VH and the maximum compensation potential VH" in the small dot drive signal larger than the difference between the intermediate potential VM and the second compensation intermediate potential VM" in the medium dot drive signal. That is, the initial potential of the subsequent waveform element is set so that the difference between the termination potential of the previous waveform element and the initial potential of the subsequent waveform element becomes larger as the termination potential of the previous waveform element is higher, because the higher the termination potential of the previous waveform element, the larger the potential drop in the supply period of no drive signal. In such a configuration, the initial potential fitted to the termination potential of the previous waveform element can be determined and a rapid rise in the potential when supply of the subsequent waveform element is started can be prevented more reliably.

Then, the maximum compensation potential VH" is held for a predetermined time (P69 to P70) and third compensation element (P70 to P71) is supplied, then the potential is restored gently to the maximum potential VH and the maximum potential VH is held for a predetermined time (P71 to P72). Next, second filling waveform element (P72 to P74) is supplied and the potential is dropped from the maximum potential VH to the minimum potential VL and the minimum potential VL is held for a predetermined time. As the potential is changed, the pressure generating chamber 22 is expanded from the minimum volume to the maximum volume and the inside of the pressure generating chamber 22 becomes negative pressure, pulling a meniscus largely into the pressure generating chamber 22.

Subsequently, second ejection waveform element (P74 to P76) is supplied and the potential is raised from the minimum potential VL to the maximum potential VH. As the potential is changed, the pressure generating chamber 22 is contracted rapidly to the minimum volume and the inside of the pressure generating chamber 22 is pressurized. Immediately after this, second damping waveform element (P76 to P77) is supplied and the pressure generating chamber 22 is expanded, whereby the meniscus is pulled into the pressure generating chamber 22 and a small ink drop is jetted. If the second damping waveform element is supplied, fine expansion element (P78 to P79) and second compensation element (P81 to P82) are supplied to the piezoelectric vibrator 21 in order.

As the setting method of the initial potential in the subsequent waveform element, in addition to the described method, the potential of the piezoelectric vibrator 21 may be detected and the initial potential may be set matching the detected potential. Taking the small dot drive signal in the sixth embodiment as an example, upon completion of supplying the first waveform element in the drive signal to the piezoelectric vibrator 21, the control section 7 (a potential detector) detects the potential through an A/D converter 61 as indicated by the dotted line in FIG. 13 and monitors the potential to the time just before the third waveform element is supplied. The control section 7 determines the initial potential of the fourth waveform element (potential at P69) based on the potential just before the fourth waveform element is supplied.

In such a configuration, the initial potential of the fourth waveform element (the initial potential of the subsequent waveform element) is determined based on the potential, so that the optimum initial potential can be set reliably. Therefore, the disadvantage that the potential of the piezoelectric vibrator 21 rises rapidly just after supply of the subsequent waveform element is started can be prevented more reliably.

By the way, in the described embodiments, the potential drop in the supply period of no drive signal is permitted. However, the invention is not limited to the configuration. For example, the potential in the supply period of no drive signal may be maintained at the termination potential of the drive signal supplied just before. A seventh embodiment of the invention intended for this purpose will be discussed.

Figure 18:
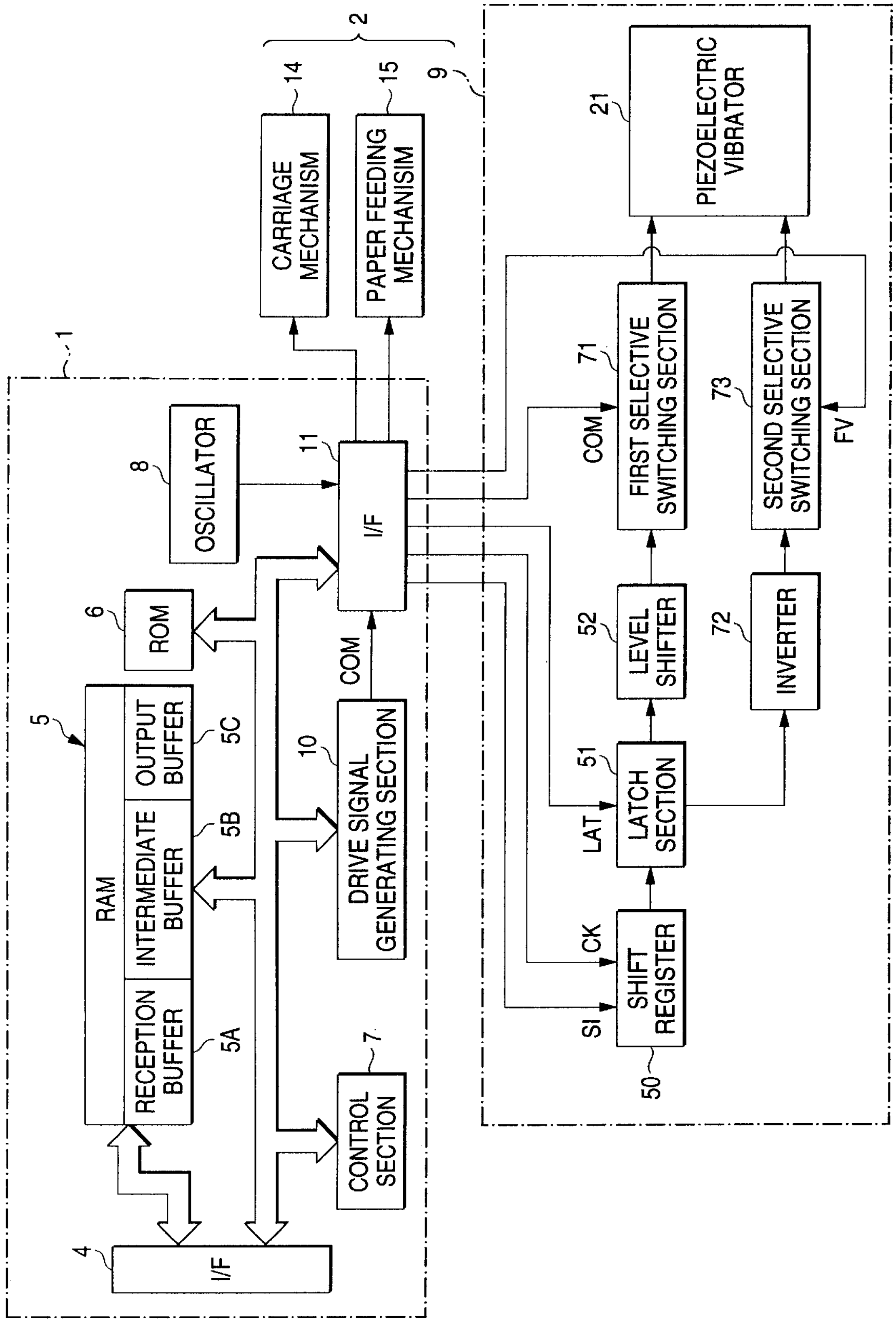
FIG. 18 is a block diagram to describe the general configuration of an ink jet recording apparatus in a seventh embodiment of the invention.

As shown in FIG. 18, an ink jet recording apparatus of the seventh embodiment is also made up of a printer controller 1 and a print engine 2. The parts identical with those previously described with reference to the figures are denoted by the same reference numerals in FIG. 18. A drive signal generating section 10 and a control section 7 make up a drive signal generator in the invention.

Figure 19:
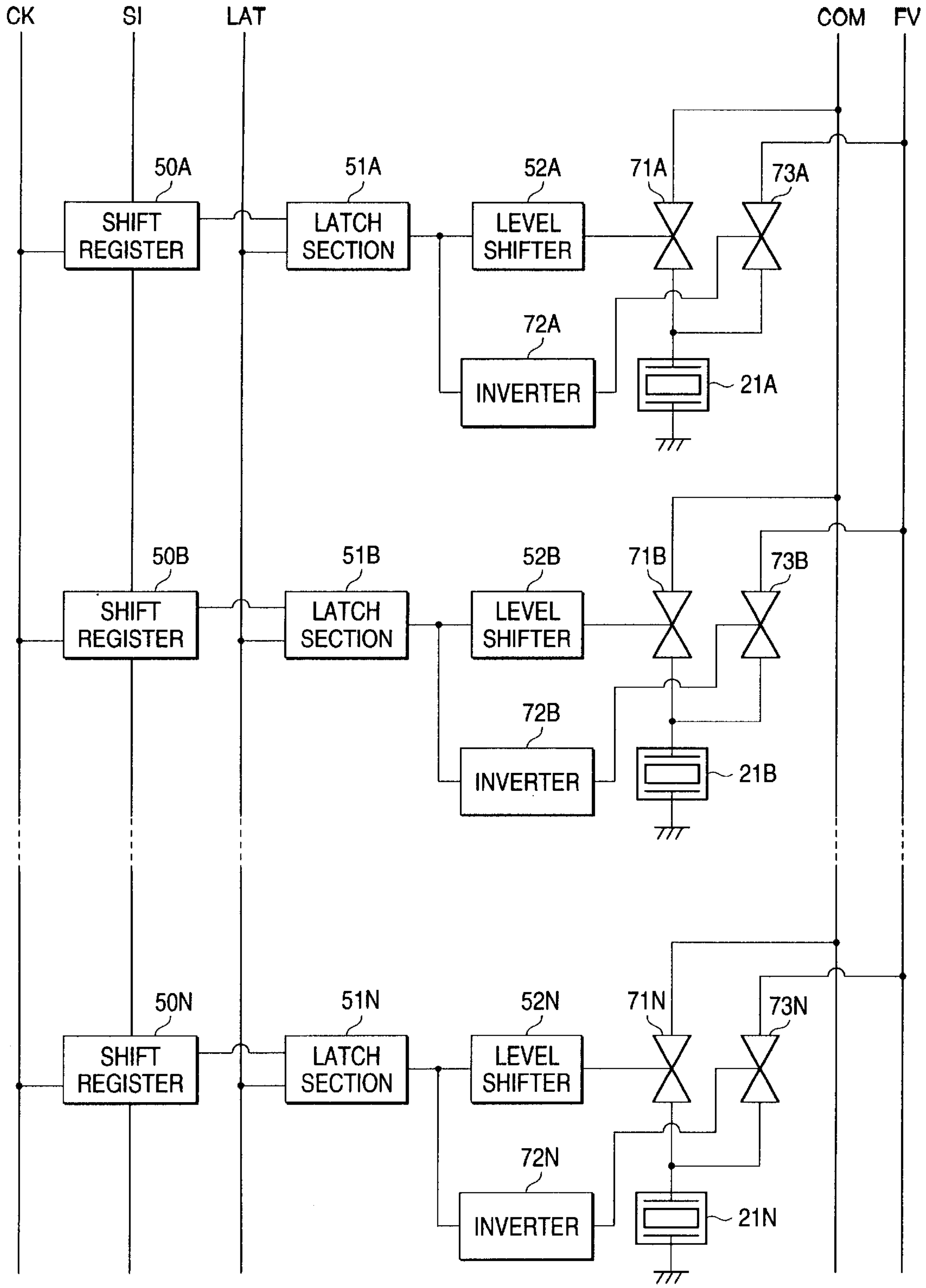
FIG. 19 is a block diagram to describe the electrical configuration of a recording head in the seventh embodiment.

A recording head 9 in the embodiment comprises shift registers 50 (50A to 50N), latch sections 51 (51A to 51N), level shifters 52 (52A to 52N), first selective switching sections 71 (71A to 71N) as first selection switches, and piezoelectric vibrators 21 (21A to 21N), as shown in FIGS. 18 and 19. Further, latched print data is supplied from the latch section 51 to an inverter 72. The inverter 72 inverts the print data latched in the latch section 51 and supplies the inversion signal as a switching signal to a second selective switching section 73 as a second selection switch. The inverter 72 is provided with a level shifter for boosting the inversion signal to a voltage at which the selective switching section 73 can be driven, as required.

Termination potential (FV) of a drive signal COM generated by the drive signal generating section 10 is supplied to input of the second selective switching section 73 and the piezoelectric vibrator 21 is connected to output of the selective switching section 73. Therefore, while the print data applied to the first selective switching section 71 is "1," for example, based on the inversion signal from the inverter 72, the selective switching section 73 is placed in a disconnection state, shutting off supply of the termination potential (FV) to the piezoelectric vibrator 21. On the other hand, while the print data applied to the selective switching section 71 is "0," the selective switching section 73 is placed in a connection state, supplying the termination potential (FV) of the drive signal applied just before to the piezoelectric vibrator 21.

The inverter 72 and the second selective switching section 73 together with the drive signal generating section 10 make up a termination potential supplier, so that after application of a waveform element to the piezoelectric vibrator 21 is cut off, the potential corresponding to the termination potential of the waveform element is supplied to the piezoelectric vibrator 21. In other words, the selective switching sections 71 and 73 are turned on alternately by the action of the inverter 72.

The print data in the embodiment is four-bit data consisting of bit 3 of the most significant bit to bit 0 of the least significant bit, such as "1010" or "0100" for each nozzle orifice, as described later. In a state in which the print data is set to "0," the corresponding selective switching section 71A–71N is placed in a disconnection (off) state, shutting off waveform element supply to the piezoelectric vibrator 21A–21N. Since the print data latched in each latch section 51A–51N is supplied to each inverter 72A–72N, each inverter 72A–72N generates control output (namely, inversion signal) in the state in which the print data is set to "0." The corresponding selective switching section 73A–73N is turned on based on the control output. Thus, the termination potential (FV) of the waveform element supplied until just before is supplied to the corresponding piezoelectric vibrator 21A–21N.

Thus, the termination potential (FV) of the immediately preceding waveform element is applied via the selective switching section 73A–73N to the piezoelectric vibrator 21A–21 over the period in which the print data is "0." Therefore, the potential of the piezoelectric vibrator 21 corresponding to the print data "0" is maintained at the termination potential (FV) if no waveform element is supplied.

This state is continued until the print data is next set to "1." Therefore, if the print data is next set to "1," the initial potential of the waveform element and the potential can be matched with each other. Thus, the problem of rapid deformation of the piezoelectric vibrator 21 can be solved and the problems of erroneous jetting of an ink drop, function degradation and destruction of the piezoelectric vibrator 21 caused by a large current, and the like can also be circumvented.

Next, a drive signal supplied to the recording head 9, ink drops jetted by the drive signal, and an example of a gradation representation method will be discussed with reference to FIG. 20, which shows a drive signal, waveform elements making up the drive signal, and a control method of gradation representation based on the application timings of the waveform elements. The drive signal generated by the drive signal generating section 10 is made up of a first pulse as a first waveform element (P90 to P96), a second pulse as a second waveform element (P96 to P100), a third pulse as a third waveform element (P100 to P106), and a fourth pulse as a fourth waveform element (P106 to P110).

The first and third pulses have the same pulse form each for jetting an ink drop of about 10 pL, for example. The second pulse is positioned between the first and third pulses for jetting a small amount of an ink drop of about 2 pL, for example. The fourth pulse position between the third and first pulses is provided for giving fine vibration to ink in the vicinity of the nozzle orifice 20 for preventing an increase in ink viscosity. Therefore, an ink drop is not jetted if the fourth pulse is applied.

Figure 20:
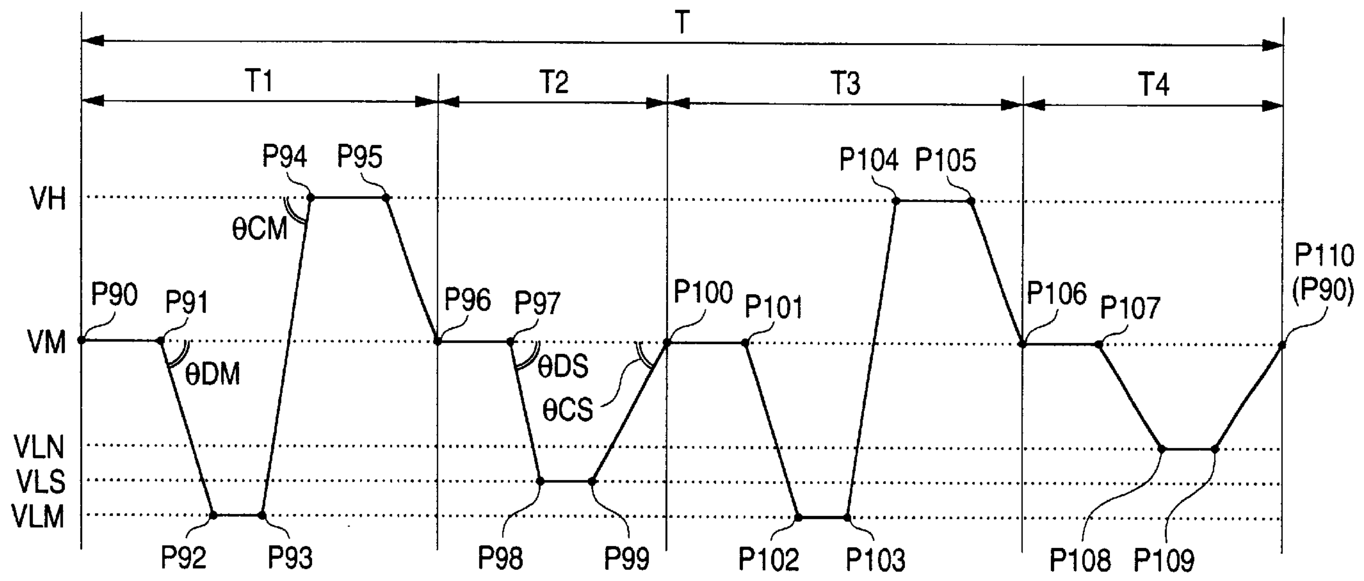
FIG. 20 is a drawing to describe a drive signal and a gradation representation control method in the seventh embodiment.

The voltage value of the first pulse shown in FIG. 20 starts at intermediate potential VM (P90 to P91) and is dropped from the intermediate potential VM to first minimum potential VLM on a predetermined voltage gradient θDM (P91 to P92), and the minimum potential VLM is maintained for a predetermined time (P92 to P93). Next, the voltage value of the first pulse is raised from the minimum potential VLM to maximum potential VH with a predetermined voltage gradient θCM (P93 to P94).

Comparing the voltage gradient θDM at the discharge time with the voltage gradient θCM at the charge time, the latter is set larger than the former. The time required for raising the voltage value of the first pulse from the minimum potential VLM to the maximum potential VH is set to almost the same as the natural vibration period of the piezoelectric vibrator 21. Preferably, the minimum potential VLM is the same as reference potential (0 V) or a positive potential to prevent polarization inversion of the piezoelectric vibrator 21.

After holding the maximum potential VH for a predetermined time (P94 to P95), the first pulse again is dropped to the intermediate potential VM (P95 to P96). The time between the start of voltage rise from the minimum potential VLM and the termination of maintaining the maximum potential VH is set to almost the same as the proper period (Helmholtz period) of ink.

The voltage value of the second pulse, like that of the first pulse, starts at the intermediate potential VM (P96 to P97) and is dropped to second minimum potential VLS on a predetermined voltage gradient θDS (P97 to P98). The minimum potential VLS of the second pulse is set higher than the minimum potential VLM of the first pulse. After maintaining the minimum potential VLS for a predetermined time (P98 to P99), the voltage value of the second pulse is raised to the intermediate potential VM with a predetermined voltage gradient θCS (P99 to P100). In the second pulse, the voltage gradient θDS at the discharge time is set larger than the voltage gradient θCS at the charge time.

The third pulse has the same waveform as the first pulse, as described above and will not be discussed. The time interval between the first and third pulses is a half the print period T. That is, if the first and third pulses are selected to form a large dot on recording paper, an ink drop equivalent to a medium dot is jetted at equal time intervals. Specifically, letting the print period be 14.4 kHz, for example, the jetting period of an ink drop equivalent to a medium dot is set to 28.8 kHz. The time between the first and third pulses is set to the maximum drive period of the recording head 9.

The voltage of the fourth pulse, like that of the first, second, or third pulse, starts at the intermediate potential VM (P106) and is dropped to third minimum potential VLN (P107 to P108). After maintaining the minimum potential VLN for a predetermined time (P108 to P109), the voltage of the fourth pulse is raised to the intermediate potential VM (P109 to P110).. Since the fourth pulse is a pulse for giving fine vibration to such an extent that an ink drop is not jetted, the minimum potential VLN of the fourth pulse is set close to the intermediate potential VM rather than to the minimum potential VLS of the second pulse. The voltage gradient at the discharge time based on the fourth pulse is set almost equal to the voltage gradient at the charge time.

Next, a method of selecting one or more of the first pulse (medium dot), the second pulse (small dot), the third pulse (medium dot), and the fourth pulse (fine vibration) for making multi-level gradation representation will be discussed with reference to FIGS. 19 and 20.

As described above, while each bit of the print data applied from each shift register 50A–50N through the latch section 51A–51N, etc., to the first selective switching section 71A–71N is "1," the drive signal is applied to the piezoelectric vibrator 21A–21N, which is then expanded or contacted in response to the waveform of the drive signal. On the other hand, while each bit of the print data is "0," supply of the drive signal to the piezoelectric vibrator 21A–21N is shut off.

Therefore, each bit of the print data is set to "1" or "0" matching the generation timing of the drive signal repeatedly generated as shown in FIG. 20, whereby one or more of the first to fourth bits can be selected. If dots are formed on recording paper with four patterns of forming no dot (gradation value 1), forming only one small dot (gradation value 2), forming only one medium dot (gradation value 3), and forming two medium dots to form one large dot (gradation value 4), for example, four-level dot gradation can be provided.

For the four-level gradation as described above, each gradation value can be represented as two-bit data, such as the gradation value 1 as "00," the gradation value 2 as "01," the gradation value 3 as "10," and the gradation value 4 as "11," as shown in FIG. 20.

For the gradation value 1 for forming no dot (jetting no ink drop), the fourth pulse for only generating fine vibration may be supplied to the piezoelectric vibrator 21A–21N, as indicated by the circle in FIG. 20. Therefore, for the gradation value 1, if "0" is applied to the selective switching section 71A–71N while the first to third pulses are generated and "1" is applied in synchronization with the generation timing of the fourth pulse, only the fourth pulse can be applied to the piezoelectric vibrator 21A–21N.

That is, the two-bit data "00" indicating the gradation value 1 is translated (decoded) into four-bit data "0001," whereby only the fourth pulse for jetting no ink drop can be applied to the piezoelectric vibrator 21A–21N, so that the gradation value 1 for forming no dot can be realized.

Likewise, if "0" is applied to the first selective switching section 71A–71N while the first, third, and fourth pulses are generated and "1" is applied in synchronization with the generation timing of the second pulse, only the second pulse can be applied to the piezoelectric vibrator 21A–21N. Likewise, the two-bit data "01" indicating the gradation value 2 is translated (decoded) into four-bit data "0100," whereby only the second pulse for forming a small dot can be applied to the piezoelectric vibrator 21A–21N, so that the gradation value 2 for forming a small dot can be realized.

Likewise, if the two-bit data "10" indicating the gradation value 3 is decoded into four-bit data "1000" and the four-bit data is given to the first selective switching section 71A–71N, only the first pulse is applied to the piezoelectric vibrator 21A–21N and one medium dot is formed on recording paper, so that the gradation value 3 is realized.

Further, if the two-bit data "11" indicating the gradation value 4 is decoded into four-bit data "1010" and the four-bit data is given to the first selective switching section 71A–71N, only the first and third pulses each for forming a medium dot are applied to the piezoelectric vibrator 21A–21N, whereby an ink drop equivalent to a medium dot is jetted on recording paper two successive times and the ink drops are mixed into one substantially large dot on the paper, namely, the gradation value 4 for forming one large dot can be realized.

Next, FIGS. 21 and 22 show the action of the termination potential supplier executed at the same time when one or more of the first pulse (medium dot), the second pulse (small dot), the third pulse (medium dot), and the fourth pulse (fine vibration) are selected for making multi-level gradation representation.

Figure 21A:
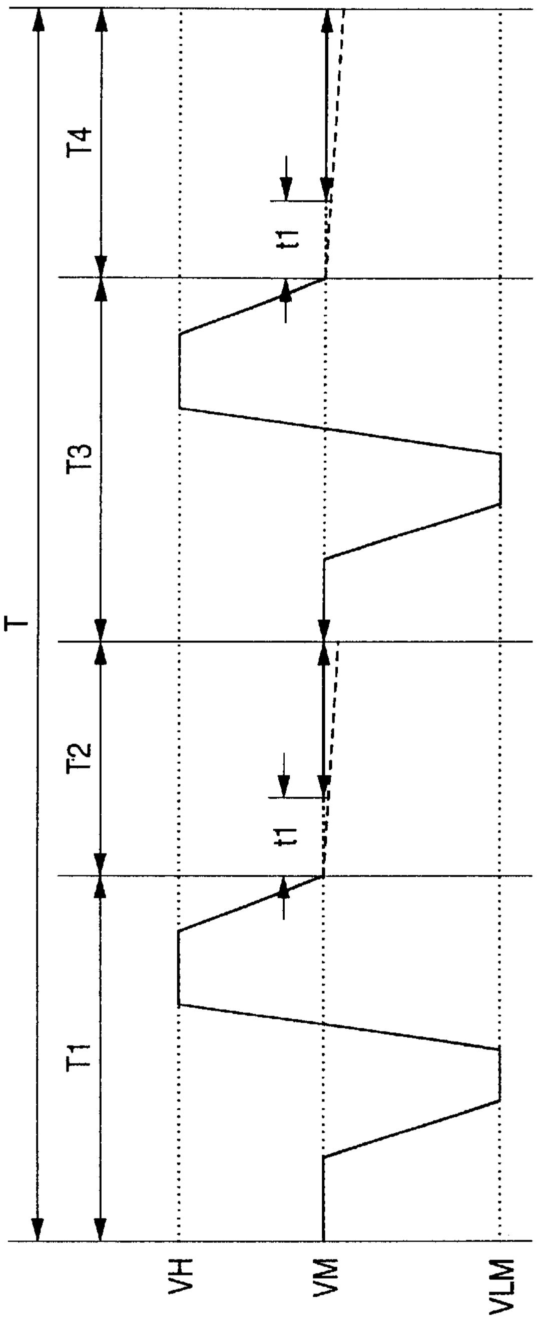
FIGS. 21A and 21B are drawing to describe the action of termination potential supplier in the seventh embodiment.

First, FIG. 21A shows the action of the termination potential supplier to eject the first and third pulses in one print period T for forming a large dot on recording paper. In this case, the first selective switching section 71A–71N is turned on in the generation time of the first pulse, T1, and the generation time of the third pulse, T3, as described above. At this time, the second selective switching section 73A–73N is turned off by the action of the inverter 72A–72N, as shown in FIG. 19.

As shown in FIG. 21A, each pulse signal is not selected in the generation time of the second pulse, T2, or the generation time of the fourth pulse, T4. That is, each bit of the print data is "0" in the generation time of the second pulse, T2, and the generation time of the fourth pulse, T4. Therefore, the first selective switching section 71A–71N is turned off and the second selective switching section 73A–73N is turned on by a switching signal from the inverter 72A–72N. Thus, the termination potential FV of the waveform element applied as shown in FIG. 19 is applied through the selective switching section 73A–73N to the piezoelectric vibrator 21A–21N.

In the embodiment, the termination potential FV corresponds to the intermediate potential VM. The potential indicated by the phantom line in FIG. 21A indicates the potential dropped because of natural discharge of the piezoelectric vibrator 21 when there is not the supplier of the termination potential FV with the selective switching section 73A–73N.

In the embodiment, the second selective switching section 73A–73N is made of an analog switch. The analog switch is driven by a switching signal provided by inverting the print data latched in the latch section 51A–51N by the inverter 72A–72N. Thus, the termination potential FV (intermediate potential VM) is supplied after the expiration of time t1 since supply of the first and third pulses was stopped. The time delay t1 is within 1 μsec.

Generally, in the recording head 9 of this kind using the piezoelectric vibrator 21 of a piezoelectric element, the natural vibration period of the vibration system combining the structure and ink fluid, Tc, is 6–10 μsec, and the print period T of the drive signal is set to about 10 times the natural vibration period Tc. Thus, if the second selective switching section 73A–73N is turned on within the range of 5–20 μsec after supply of the third pulse is stopped, an effective function can be provided on practical use.

In such a configuration, the termination potential FV is supplied to the piezoelectric vibrator 21A–21N after the expiration of time t1 since supply of the first and third pulses was stopped. Thus, the potential is also maintained at the termination potential FV in the supply period of no waveform element. Therefore, potential change of the piezoelectric vibrator 21 when supply of the next waveform element is started can be eliminated or can be made extremely small. Thus, ink drops can be prevented from being jetted in error from the recording head 9, and degradation or destroying of the piezoelectric vibrator 21 can be prevented.

Next, FIG. 21 B shows the action of the termination potential supplier to supply one first pulse in one print period T for forming a medium dot on recording paper. In this case, the first selective switching section 71A–71N is turned on in the generation time of the first pulse, T1. At this time, the second selective switching section 73A–73N is turned off by the action of the inverter 72A–72N, as shown in FIG. 19.

Figure 21B:
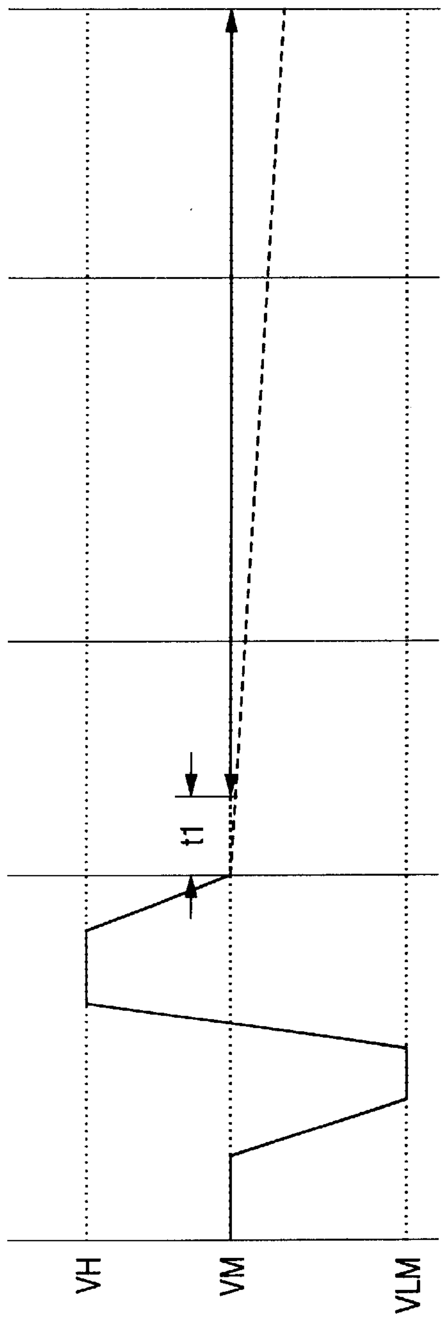

Each pulse signal is not selected in the generation time of the second pulse, the third pulse, or the fourth pulse, T2, T3, or T4. That is, each bit of the print data is "0" in the generation times of the second pulse, the third pulse, and the fourth pulse. Therefore, the first selective switching section 71A–71N is turned off and the second selective switching section 73A–73N is turned. on by a switching signal from the inverter 72A–72N. Therefore, the termination potential FV is applied through the second selective switching section 73A–73N to the piezoelectric vibrator 21A–21N after the expiration of time t1 since supply of the first pulse was stopped, as shown in FIG. 21B.

Thus, the potential of the piezoelectric vibrator 21 is maintained at the termination potential FV (intermediate potential VM) in the supply period of no waveform element. Therefore, change in the potential when supply of the next waveform element is started can be eliminated or can be made extremely small. The potential indicated by the phantom line in FIG. 21B indicates the potential dropped because of natural discharge of the piezoelectric vibrator 21 when there is not the supplier of the termination potential FV with the second selective switching section 73A–73N.

Figure 22A:
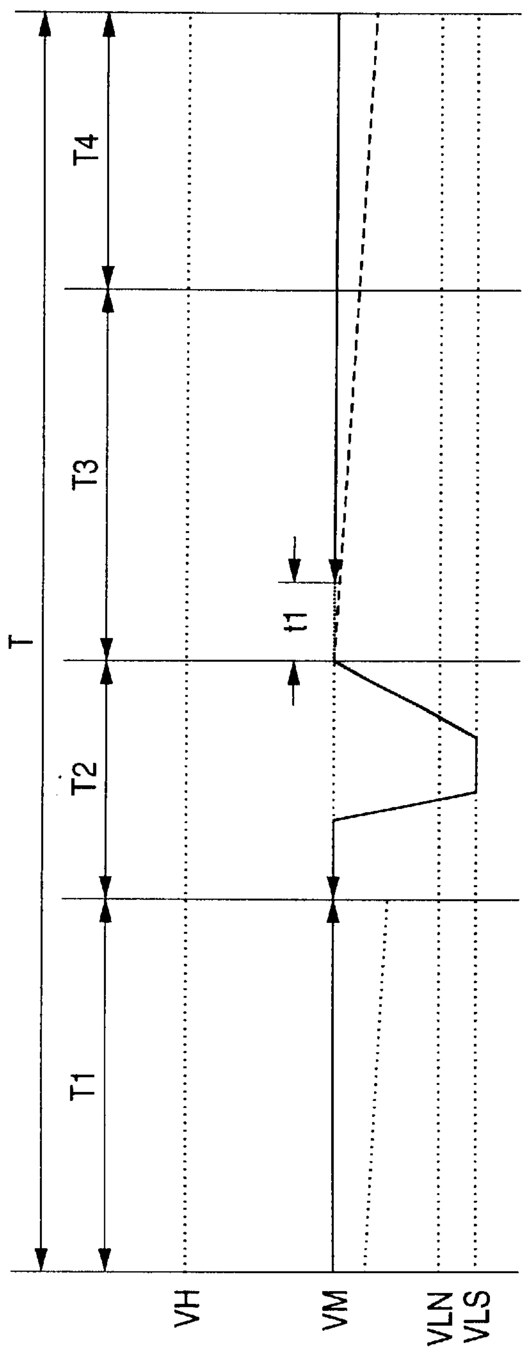
FIGS. 22A and 22B are drawing to describe the action of termination potential supplier in the seventh embodiment.

FIG. 22A shows the action of the termination potential supplier to form a small dot on recording paper in one print period T. In this case, the first selective switching section 71A–71N is turned on in the generation time of the second pulse, T2. At this time, the second selective switching section 73A–73N is turned off by a switching signal from the inverter 72A–72N.

Each pulse signal is not selected in the generation time of the first pulse, the third pulse, or the fourth pulse, T1 T3, or T4. That is, the second selective switching section 73A–73N is turned on by a switching signal from the inverter 72A–72N in the generation times of the first pulse, the third pulse, and the fourth pulse. Therefore, the termination potential FV is applied through the second selective switching section 73A–73N to the piezoelectric vibrator 21A–21N after the expiration of time t1 since supply of the second pulse was terminated.

Thus, the potential of the piezoelectric vibrator 21 is maintained at the termination potential FV in the supply period of no waveform element. Therefore, change in the potential when the next drive signal is supplied can be eliminated or can be made extremely small. The potential indicated by the phantom line in FIG. 22A indicates the potential dropped because of natural discharge of the piezoelectric vibrator 21 when there is not the supplier of the termination potential FV with the second selective switching section 73A–73N.

Figure 22B:
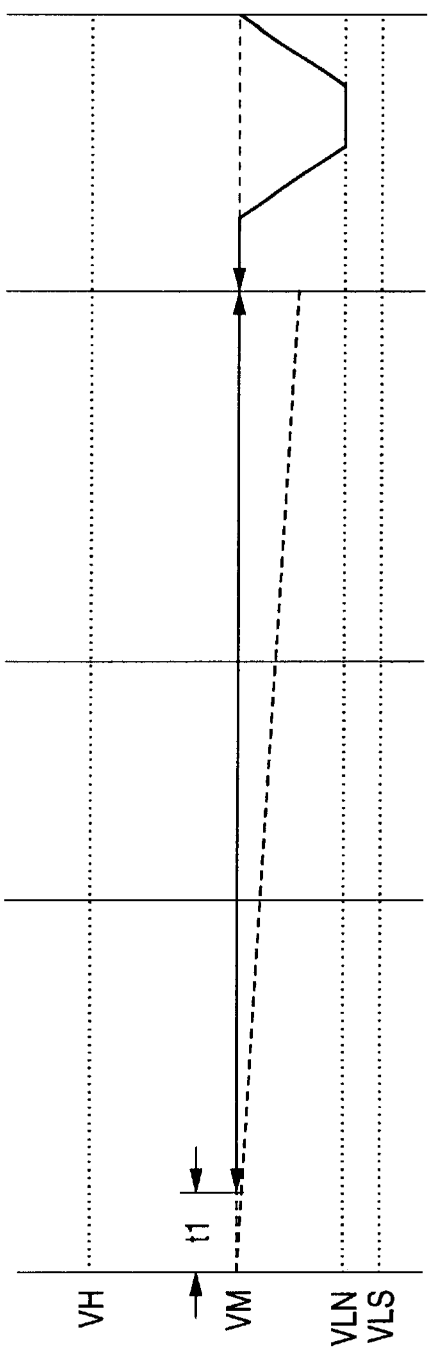

Further, FIG. 22B shows the action of supplying the termination potential FV after only the fourth pulse is supplied in one print period T for giving fine vibration to ink in the vicinity of the nozzle orifice 20 of the recording head 9. In this case, the first selective switching section 71A–71N is turned on in the generation time of the fourth pulse, T4. At this time, the second selective switching section 73A–73N is turned off by a switching signal from the inverter 72A–72N.

Each pulse signal is not selected in the generation time of the first pulse, the second, or the third pulse, T1, T2, or T3. That is, the selective switching section 73A–73N is turned on by a switching signal from the inverter 72A–72N in the generation times of the first pulse, the second, and the third pulse. Therefore, the termination potential FV (intermediate potential VM) is supplied to the piezoelectric vibrator 21A–21N after the expiration of time t1 since supply of the fourth pulse was stopped in the previous print period.

Thus, the potential of the piezoelectric vibrator 21 is maintained at the termination potential FV in the supply period of no waveform element. Therefore, change in the potential in the piezoelectric vibrator 21 when the next drive signal is supplied can be eliminated or can be made extremely small. The potential indicated by the phantom line in FIG. 22B indicates the potential dropped because of natural discharge of the piezoelectric vibrator 21 when there is not the supplier of the termination potential FV.

Figure 23:
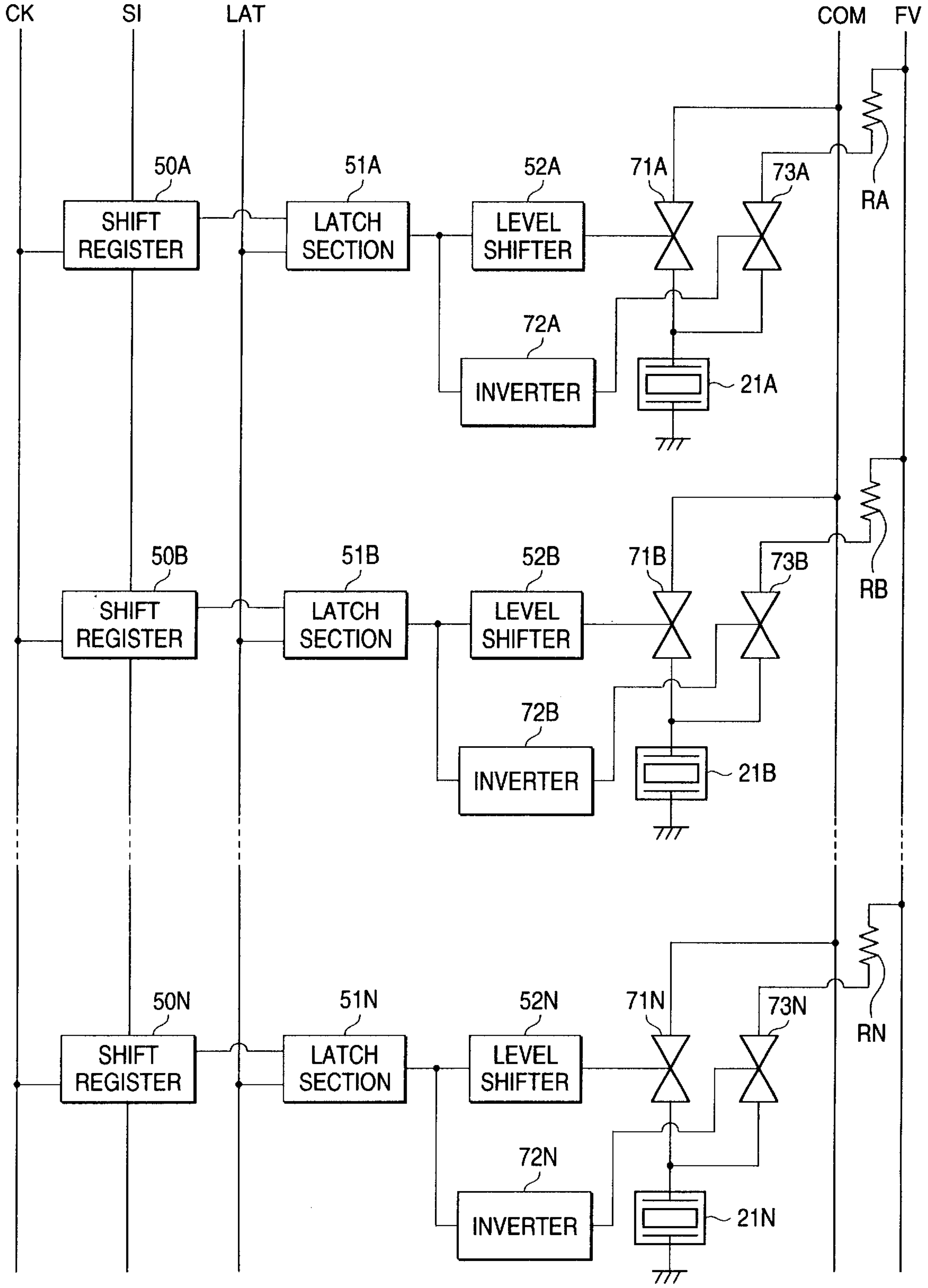
FIG. 23 is a block diagram to describe the electrical configuration of a recording head in an eighth embodiment of the invention.

Next, FIG. 23 shows an eighth embodiment of the invention. In the eighth embodiment, a current limiter is placed between a termination potential supply source indicated as FV and a selective switching section 73. Other components are similar to those in the seventh embodiment and therefore the parts identical with those previously described with reference to FIG. 19 (seventh embodiment) are denoted by the same reference numerals in FIG. 23.

Resistance elements RA to RN connected in series each between the termination potential supply source indicated as FV and each selective switching section 73A–73N are used as the current limiter.

Figure 24:
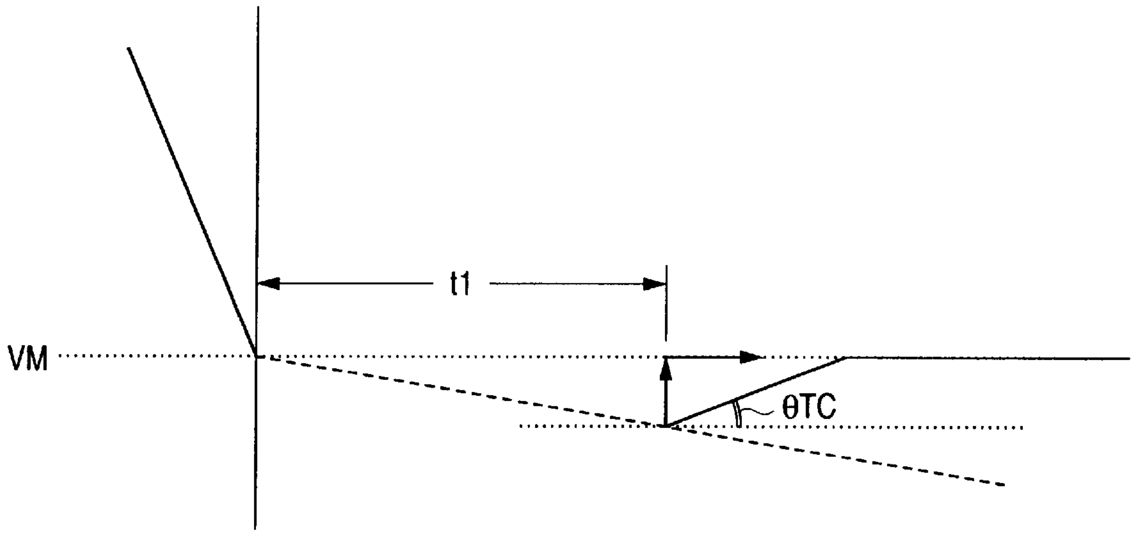
FIG. 24 is a drawing to describe the action of a resistance element in the eighth embodiment.

FIG. 24 shows the action to use the resistance elements RA to RN as the current limiter. The potential indicated by the phantom line in FIG. 24 indicates the potential dropped because of natural discharge of a piezoelectric vibrator 21; the potential indicated by the phantom line starts to lower at least to the ground level after the expiration of t1 since supply of waveform element was stopped.

Then, in the embodiment, the resistance elements RA to RN are disposed as mentioned above, so that the potential is restored comparatively gently from the potential just after the expiration of t1 to the potential FV (intermediate potential VM) based on the time constant of each resistance element RA to RN and the condenser component of the piezoelectric vibrator 21A–21N. That is, the potential is restored from the potential just after the expiration of t1 to the potential FV with a voltage gradient indicated by θTC, whereby a rapid potential variation can be suppressed.

The value of each resistance element RA to RN defining the time constant is set to such an extent that the voltage gradient indicated by θTC does not cause erroneous jetting of an ink drop.

By the way, in the described embodiments, the drive signal of the recording head 9 made up of the first to fourth pulses starts at the intermediate potential VM and ends with the intermediate potential VM as shown in FIG. 20.

However, a drive signal sequence capable of selectively generating a large, medium, or small dot and giving a fine vibration pulse may comprise a waveform element starting at a potential other than the intermediate potential VM and ending with a potential other than the intermediate potential VM.

Figure 25:
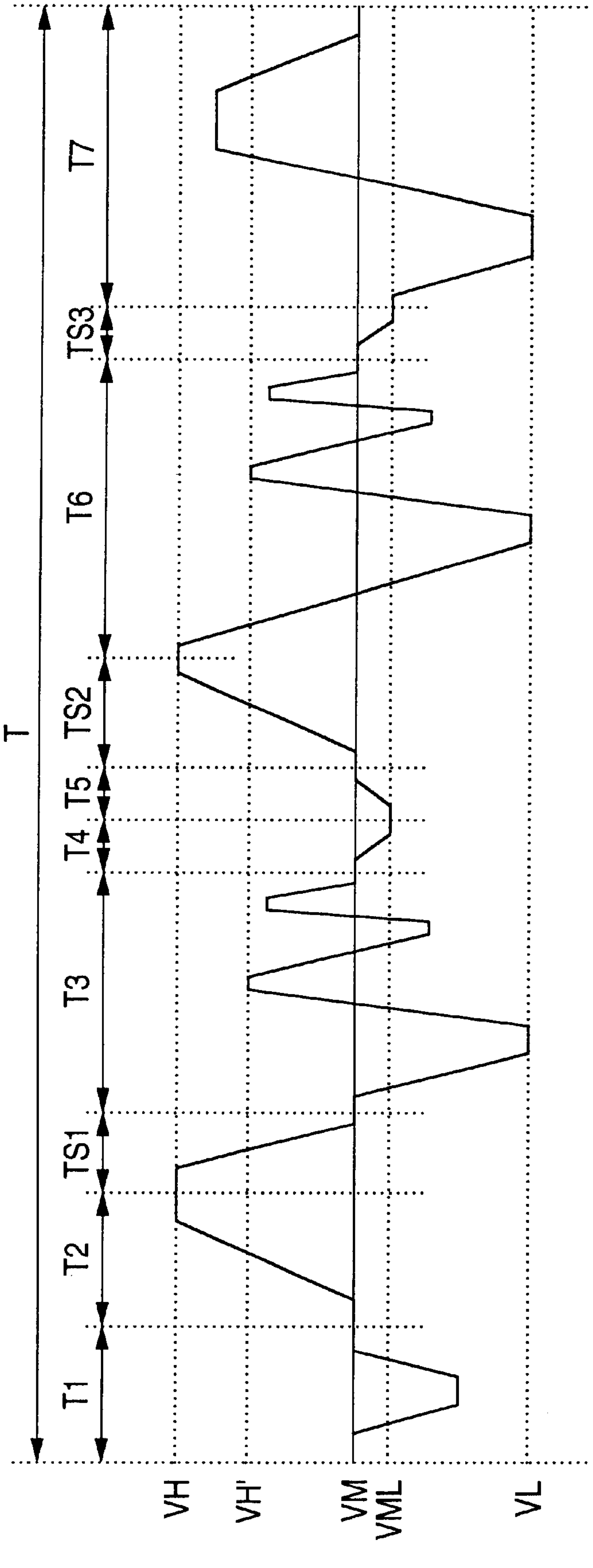
FIG. 25 shows an example of a drive signal sequence capable of generating a large dot drive pulse, a medium dot drive pulse, a small dot drive pulse, and a fine vibration pulse.

FIG. 25 shows an example of a drive signal sequence capable of generating a large dot drive pulse, a medium dot drive pulse, a small dot drive pulse, and a fine vibration pulse.

In the drive signal sequence shown in FIG. 25, the waveform element forming a fine vibration pulse is divided into three parts, which are placed in times T1, T4, and T5. The waveform element forming a small dot drive pulse is divided into two parts, which are placed in times T2 and T6. The waveform element forming a medium dot drive pulse is not divided and is placed in time T3. Further, the waveform element forming a large dot drive pulse is divided into two parts, which are placed in times T4 and T7. The waveform element in the time T4 is used in common to the large dot drive pulse and the fine vibration pulse. A first connection element is placed in time TS1 between the times T2 and T3. Likewise, a second connection element is placed in time TS2 between the times T5 and T6 and a third connection element is placed in time TS3 between the times T3 and T4.

Using the drive signal sequence, the waveform element supplier selects the fourth waveform element in the time T4 and the seventh waveform element in the time T7 from the drive signal sequence based on print data, thereby generating a large dot drive pulse. The waveform element supplier selects the third waveform element in the time T3 from the drive signal sequence, thereby generating a medium dot drive pulse. Further, the waveform element supplier selects the second waveform element in the time T2 and the sixth waveform element in the time T6 from the drive signal sequence and concatenates the waveform elements, thereby generating a small dot drive pulse. Further, the waveform element supplier selects the first waveform element in the time T1, the fourth waveform element in the time T4, and the fifth waveform element in the time T5 from the drive signal sequence and concatenates the waveform elements, thereby generating a fine vibration pulse.

In this case, focusing attention on generation of the large dot drive pulse, the fourth waveform element in the time T4 has the termination potential of second intermediate potential VML slightly lower than the intermediate potential VM and the seventh waveform element in the time T7 has the initial potential of VML. Further, the seventh waveform element in the time T7 has the termination potential of the intermediate potential VM and the fourth waveform element in the time T4 has the initial potential of VM. Likewise, focusing attention on generation of the small dot drive pulse, the second waveform element in the time T2 has the termination potential of the maximum potential VH and the sixth waveform element in the time T6 has the initial potential of VH. Further, the sixth waveform element in the time T6 has the termination potential of the intermediate potential VM and the second waveform element in the time T2 has the initial potential of VM.

In this example, as the termination potential of each drive pulse, the intermediate potential VM, the second intermediate potential VML, and the maximum potential VH are generated, as mentioned above. Therefore, to use the drive signal sequence, termination potential supplier capable of generating different types of potentials made up of the intermediate potential VM, the second intermediate potential VML, and the maximum potential VH needs to be provided.

Figure 26:
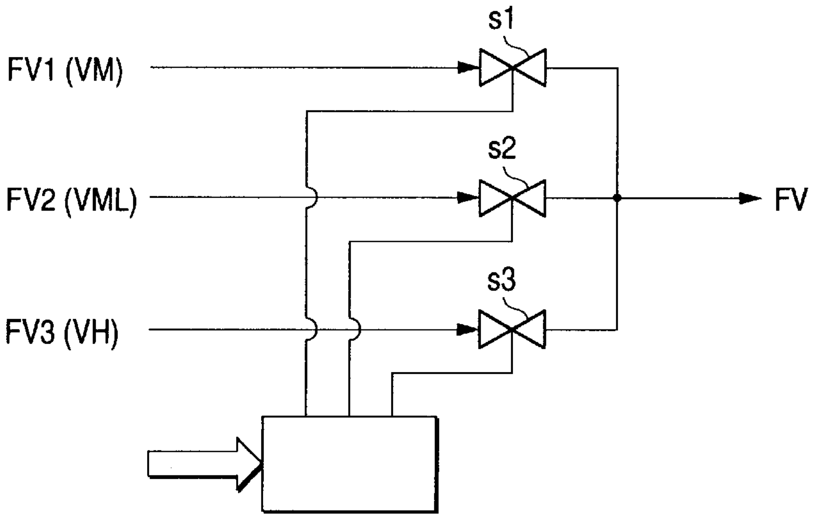
FIG. 26 is a drawing to describe a ninth embodiment of the invention.

FIG. 26 is a drawing to described a ninth embodiment of the invention wherein termination potential supplier capable of generating different types of termination potentials is provided and any of the termination potentials can be appropriately selected and output to a termination potential supply line. The configuration shown in FIG. 26 is provided substantially by a control section 7 and a drive signal generating section 10.

As shown in FIG. 26, in the embodiment, the drive signal generating section 10 generates three types of termination potentials, for example, indicated as FV1, FV2, and FV3. The potentials output to the FV1 to FV3 correspond to the intermediate potential VM, the second intermediate potential VML, and the maximum potential VH.

Any of the termination potentials is output through an analog switch S1–S3 corresponding to the termination potential to the termination potential supply line. In this case, the switches S1 to S3 are turned on alternately in response to a command from the control section 7. The control section 7 outputs any termination potential indicated as FV1 (VM), FV2 (VML), or FV3 (VH) corresponding to the termination potential at the time in accordance with the drive signal supply stop timing to the termination potential supply line FV.

Thus, after waveform element supply is stopped, the FV1, FV2, or FV3 is also supplied to piezoelectric vibrator 21 through a selective switching section 73A–73N. Consequently, drop in the potential can be prevented regardless of the different potential level.

Figure 27:
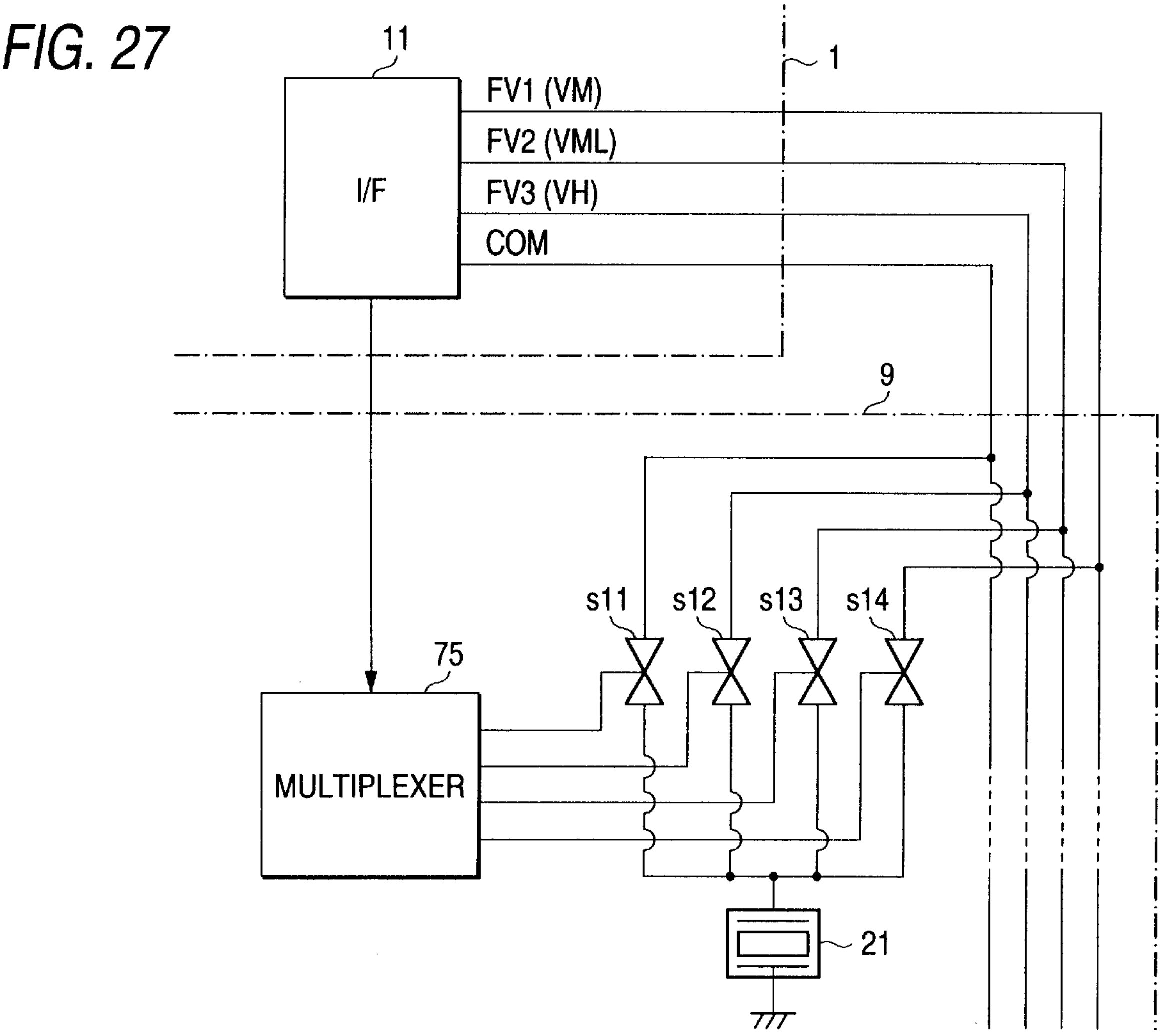
FIG. 27 is a drawing to describe a tenth embodiment of the invention.

FIG. 27 shows a tenth embodiment of the invention wherein any of different types of termination potentials FV (namely, VM, VML, or VH) is appropriately selected and applied to piezoelectric vibrator 21.

In the embodiment, a switch control signal is sent from an interface 11 of a printer controller 1 to a multiplexer 75 installed in a recording head 9. The multiplexer 75 outputs a switching signal to each switch S11–S14 so as to turn on any of the analog switches S11 to S14 alternately. A drive signal sequence as shown in FIG. 25 is supplied to the first switch S11. The first switch S11 is turned on intermittently by a switching signal from the multiplexer 75. Thus, each waveform element is selected from the drive signal sequence and is applied to the piezoelectric vibrator 21.

Consequently, the drive signal for a large dot, a medium dot, a small dot, or fine vibration is selectively applied to the piezoelectric vibrator 21 and multi-level gradation record operation is performed through the recording head 9. Thus, the first switch S11 serves an equivalent function to that of the first selective switching section 71A–71N shown in FIGS. 19 and 23.

Three different termination potentials are supplied from output terminals FV1, FV2, and FV3 on the interface 11 to the second switch S12, the third switch S13, and the fourth switch S14. In the embodiment, potentials corresponding to the intermediate potential VM, the second intermediate potential VML, and the maximum potential VH are supplied to the output terminals FV1, FV2, and FV3.

The voltage value having the same level as the termination potential when the first switch S11 is turned off, namely, the termination potential when the drive signal of the recording head 9 is stopped (any of VM, VML, or VH) is selected as any of the second switch S12 to the fourth switch S14 is turned on, and is applied to the piezoelectric vibrator 21 and is held until the next head drive signal is applied.

As such operation is executed, any of the termination potential FV1 (VM), FV2 (VML), or FV3 (VH) is selectively applied to the piezoelectric vibrator 21 in the supply period of no waveform element. Therefore, change in the potential when the next waveform element is supplied can be eliminated or can be made extremely small, so that ink drops can be prevented from being jetted in error from the recording head 9, and degradation or destroying of the piezoelectric vibrator 21 can be prevented effectively.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

For example, although the waveform element situated in the period T2*b* (the latter half of the second waveform element W2) in the first to third embodiments is arranged in the rear portion of the drive signal COM in the print time period T, the position of the waveform element is not limited to the above. For example, the waveform element may be arranged in the front portion of the drive signal COM in the print time period T. Similarly, the compensation element in the fourth to sixth embodiments may be arranged in the front portion of the drive signal COM in the print time period T. Namely, these elements may be arranged at an arbitrary position in one print time period T.

In this case, even if the potential SEG of the piezoelectric vibrator 21 has dropped when one printing time period T is selected, such arrangement also can prevent ink drops from being jetted in error due to rapid change of the potential SEG of the piezoelectric vibrator 21.

What is claimed is:

1. An ink jet recording apparatus, comprising:

a recording head including a piezoelectric vibrator to be deformed for varying the volume of a pressure generating chamber communicated with a nozzle orifice to eject an ink drop therefrom;

a drive signal generator for generating, at a reference potential, a drive signal in which a plurality of waveform elements are connected;

a waveform element supplier for selectively supplying at least two waveform elements from the drive signal to the piezoelectric vibrator; and a potential difference compensator for restoring a potential of the generated drive signal to the reference potential only when the drive signal has a respective potential below a predetermined potential.

2. The ink jet recording apparatus as set forth in claim 1, wherein the potential difference compensator includes:

a first supply switch connected between the piezoelectric vibrator and a drive signal line for supplying the drive signal to the piezoelectric vibrator in order to control the waveform element supply;

a second supply switch connected between the drive signal line and the piezoelectric vibrator in parallel with the first supply switch;

a first switch controller for supplying a first switching signal to the first switch for controlling the same;

a second switch controller for supplying a second switching signal to the second switch for controlling the same; and a rectifier connected in serial with the second supply switch such that a current flow direction from the drive signal line to the piezoelectric vibrator is defined as a forward direction.

3. The ink jet recording apparatus as set forth in claim 2, wherein the drive signal includes a first waveform element for deforming the piezoelectric vibrator and, a second waveform element, one portion of which is convex to the lower potential side;

wherein the first switch controller generates the first switching signal in at least a part of a period while the first waveform element is generated; and wherein the second switch controller generates the second switching signal at a predetermined timing in a period while the second waveform element is generated so as to turn on the second supply switch.

4. The ink jet recording apparatus as set forth in claim 3, wherein the lowest potential of the second waveform element is lower than a potential of the piezoelectric vibrator at the time where the second switch is turned on.

5. The ink jet recording apparatus as set forth in claim 3, wherein the second switch controller generates the second switching signal for turning on the second switch in a period while the potential of the second waveform element is rising.

6. The ink jet recording apparatus as set forth in claim 1, wherein the potential difference compensator includes an initial potential setter for lowering an initial potential of the subsequent waveform element than a termination potential of the previous waveform element in response to potential drop of the piezoelectric vibrator.

7. The ink jet recording apparatus as set forth in claim 6, wherein the subsequent waveform element includes a compensation element for restoring the potential thereof from the initial potential to the termination potential of the previous waveform element.

8. The ink jet recording apparatus as set forth in claim 7, wherein the waveform supplier includes a compensation element collective supplier for supplying the compensation element to every piezoelectric vibrator collectively.

9. The ink jet recording apparatus as set forth in claim 7, wherein the waveform supplier includes a compensation element selectively supplier for supplying the compensation element to a predetermined piezoelectric vibrator selectively.

10. The ink jet recording apparatus as set forth in claim 6, wherein the initial potential setter includes an initial potential adjuster for adjusting the initial potential of the subsequent waveform element.

11. The ink jet recording apparatus as set forth in claim 10, further comprising an environment information detector for acquiring information of an environment surrounding the recording head, wherein the initial potential adjuster adjusts the initial potential of the subsequent waveform element in accordance with the detected environment information.

12. The ink jet recording apparatus as set forth in claim 11, wherein the initial potential adjuster adjusts the initial potential of the subsequent waveform element such that the difference between the termination potential of the previous waveform element and the initial potential of the subsequent waveform element becomes larger as the termination potential of the previous waveform element is higher.

13. The ink jet recording apparatus as set forth in claim 11, wherein the initial potential adjuster adjusts the initial potential of the subsequent waveform element such that the difference between the termination potential of the previous waveform element and the initial potential of the subsequent waveform element becomes larger as the time period between the termination of the previous waveform element and the start end of the subsequent waveform element is longer.

14. The ink jet recording apparatus as set forth in claim 11, further comprising a potential detector for detecting a potential of the piezoelectric vibrator, wherein the initial potential adjuster adjusts the initial potential of the subsequent waveform element in accordance with the detected potential of the piezoelectric vibrator.

15. The ink jet recording apparatus as set forth in claim 11, wherein the environment information includes at least one of temperature information and humidity information.

16. The ink jet recording apparatus as set forth in claim 6, wherein the piezoelectric vibrator includes a piezoelectric layer and electrodes disposed so as to sandwich the piezoelectric layer; and wherein the piezoelectric layer has a thickness in the range of 1 $\mu$m to 20 $\mu$m.

17. An ink jet recording head comprising:

a recording head including a piezoelectric vibrator to be deformed for varying the volume of a pressure generating chamber communicated with a nozzle orifice to eject an ink drop therefrom;

a drive signal generator for generating a drive signal in which a plurality of waveform elements are connected;

a waveform element supplier for selectively supplying at least one waveform element from the drive signal to the piezoelectric vibrator; and a termination potential supplier for supplying power always having a constant potential so as to maintain a potential of the piezoelectric vibrator during a period in which no waveform element is supplied at a termination potential of a reference waveform element supplied just before.

18. The ink jet recording apparatus as set forth in claim 17, wherein the termination potential supplier supplies a potential corresponding to the termination potential of the reference waveform element after the waveform supplier has been finished to supply the reference waveform element.

19. The ink jet recording apparatus as set forth in claim 17, wherein the waveform element supplier includes a first selective switch for selectively supplying at least one of the waveform elements in the drive signal to the piezoelectric vibrator;

wherein the termination potential supplier includes a second selective switch for supplying the potential corresponding to the termination potential of the reference waveform element to the piezoelectric element selectively.

20. The ink jet recording apparatus as set forth in claim 19, further comprising a print controller for generating a latch signal, wherein the first selective switch is on/off controlled by the latch signal and the second selective switch is controlled on/off controlled by a signal generated by inverting the latch signal.

21. The ink jet recording apparatus as set forth in claim 19, wherein the second selective switch is turned on after the expiration of a predetermined time period since the first selective switch has been turned off.

22. The ink jet recording apparatus as set forth in claim 19, wherein the predetermined time period is set in the range of 5 $\mu$sec to 20 $\mu$sec.

23. The ink jet recording apparatus as set forth in claim 19, wherein the termination potential supplier includes a supply source for supplying the termination potential and a current limiter provided between the supply source and the second selective switch.

24. The ink jet recording apparatus as set forth in claim 23, wherein the current limiter is configured as a resistance element connected in series between the supply source and the second selective switch.

25. The ink jet recording apparatus as set forth in claim 17, wherein the waveform element supplier includes a first selective switch for selectively supplying at least one of the waveform elements in the drive signal to the piezoelectric vibrator;

wherein the termination potential supplier includes a second selective switch for selectively supplying one of predetermined different potentials in response to a termination potential of a waveform element selectively supplied by the first selective switch.

26. The ink jet recording apparatus as set forth in claim 17, wherein the piezoelectric vibrator is configured as a piezoelectric element.

27. The ink jet recording apparatus as set forth in claim 17, wherein the piezoelectric vibrator includes a piezoelectric layer and electrodes disposed so as to sandwich the piezoelectric layer; and wherein the piezoelectric layer has a thickness in the range of 1 $\mu$m to 20 $\mu$m.

28. The ink jet recording apparatus as set forth in claim 1, wherein the piezoelectric vibrator is configured as a piezoelectric element.

29. The ink jet recording apparatus as set forth in claim 1, wherein the piezoelectric vibrator includes a piezoelectric layer and electrode s disposed so as to sandwich the piezoelectric layer; and wherein the piezoelectric layer has a thickness in the range of 1 $\mu$m to 20 $\mu$m.

* * * * *